(12) United States Patent
Ahn et al.

(10) Patent No.: US 7,566,619 B2
(45) Date of Patent: Jul. 28, 2009

(54) METHODS OF FORMING INTEGRATED CIRCUIT DEVICES HAVING FIELD EFFECT TRANSISTORS OF DIFFERENT TYPES IN DIFFERENT DEVICE REGIONS

(75) Inventors: Young-Joon Ahn, Gyeonggi-do (KR); Dong-Gun Park, Gyeonggi-do (KR); Choong-Ho Lee, Gyeonggi-do (KR); Hee-Soo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 425 days.

(21) Appl. No.: 11/110,167

(22) Filed: Apr. 20, 2005

(65) Prior Publication Data

US 2005/0239252 A1    Oct. 27, 2005

(30) Foreign Application Priority Data

Apr. 27, 2004    (KR) .................. 10-2004-0029118

(51) Int. Cl.
*H01L 21/336* (2006.01)

(52) U.S. Cl. .............. 438/268; 438/149; 438/138; 438/156; 438/336; 438/212; 257/296; 257/301; 257/302; 257/328

(58) Field of Classification Search .......... 257/347, 257/627, 296, 301, 302, 328, E51.005; 438/198, 438/149, 268, 137, 138, 156, 336, 212
See application file for complete search history.

(56) References Cited

U.S. PATENT DOCUMENTS

| | | | |
|---|---|---|---|
| 5,917,218 A | 6/1999 | Choi et al. | |
| 5,981,324 A | 11/1999 | Seo et al. | |
| 6,071,775 A | 6/2000 | Choi et al. | |
| 6,184,085 B1 | 2/2001 | Jeong | |
| 6,580,137 B2* | 6/2003 | Parke | 257/401 |
| 6,642,090 B1 | 11/2003 | Fried et al. | |
| 7,101,742 B2* | 9/2006 | Ko et al. | 438/197 |
| 2003/0102518 A1 | 6/2003 | Fried et al. | |
| 2004/0217433 A1* | 11/2004 | Yeo et al. | 257/412 |
| 2006/0214226 A1* | 9/2006 | Chen et al. | 257/347 |

FOREIGN PATENT DOCUMENTS

KR     1020020021894     3/2002

* cited by examiner

*Primary Examiner*—Thao X Le
*Assistant Examiner*—Thanh Y Tran
(74) *Attorney, Agent, or Firm*—Myers Bigel Sibley & Sajovec, P.A.

(57) ABSTRACT

A method of forming an integrated circuit device includes forming a non-planar field-effect transistor in a cell array portion of a semiconductor substrate and forming a planar field-effect transistor in a peripheral circuit portion of the semiconductor substrate. The non-planar field-effect transistor may be selected from the group of a FinFET and a recessed gate FET. Dopants may be implanted into a channel region of the non-planar field-effect transistor, and a cell protection layer may be formed on the non-planar field-effect transistor. Then, dopants may be selectively implanted into a channel region of the planar field-effect transistor using the cell protection layer as a mask to block implanting of the dopants into the channel region of the non-planar field-effect transistor.

13 Claims, 27 Drawing Sheets

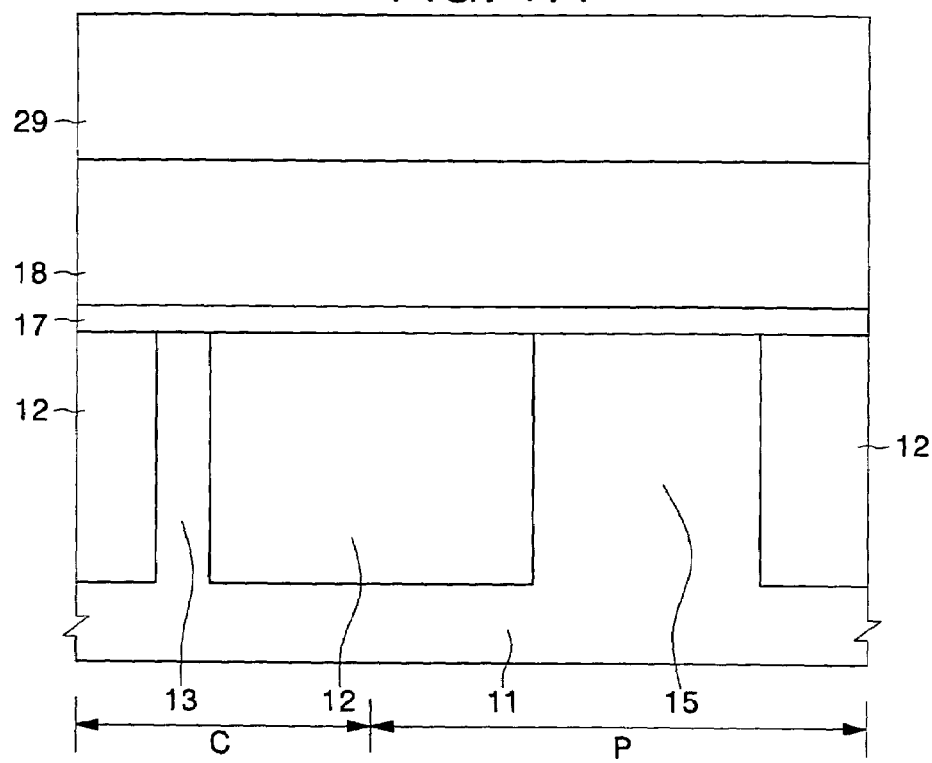
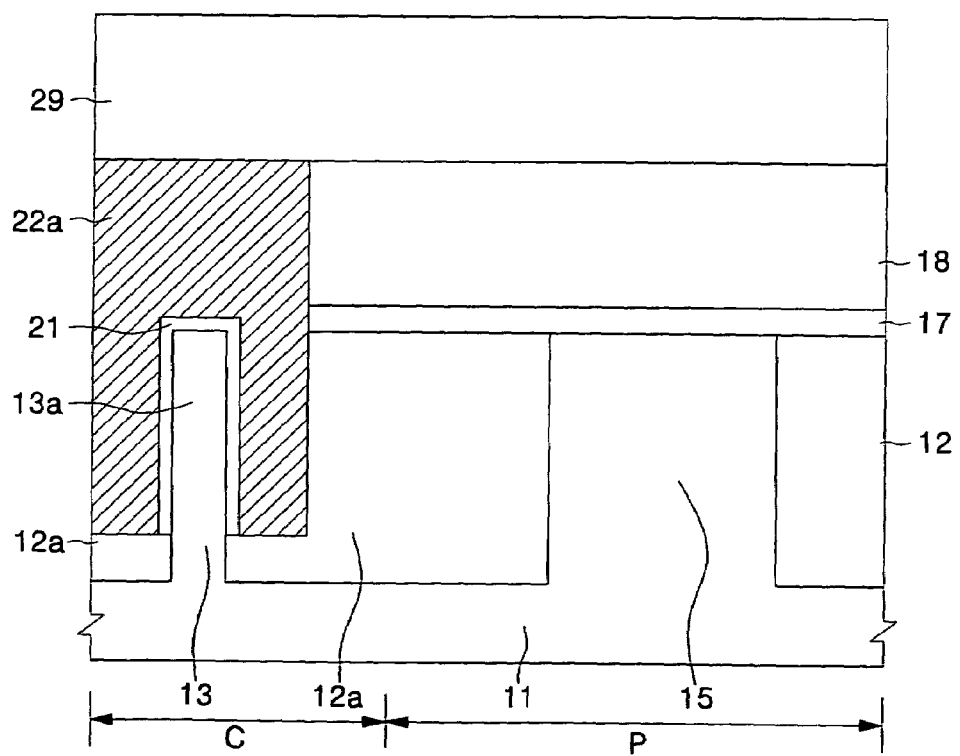

METHODS OF FORMING INTEGRATED CIRCUIT DEVICES HAVING FIELD EFFECT TRANSISTORS OF DIFFERENT TYPES IN DIFFERENT DEVICE REGIONS

CROSS-REFERENCE TO RELATED APPLICATION

This application claims priority from Korean Patent Application No. 10-2004-0029118, filed Apr. 27, 2004, the contents of which are hereby incorporated by reference herein in their entirety.

BACKGROUND OF THE INVENTION

1. Field of the Invention

The present invention relates to semiconductor devices, and more particularly, to methods of forming field effect transistors on a semiconductor substrate.

2. Description of Related Art

Due to demand for smaller and more power-efficient electronic devices, research on methods of increasing semiconductor device integration is actively being pursued. In order to reduce transistor size to meet these demands for higher device integration, increasingly fine transistor patterns may be required. However, as transistor size decreases, a variety of problems may result, such as short channel effects. As such, research is being conducted on fin field-effect transistors (FinFETs), which may reduce short channel effects.

A method of fabricating a Fin FET is disclosed in U.S. Pat. No. 6,642,090 entitled "Fin FET Devices from Bulk Semiconductor and Method for Forming" to Fried, et al., the disclosure of which is hereby incorporated by reference.

FIG. 1 is a cross-sectional view illustrating exemplary methods of fabricating FinFETs as described in U.S. Pat. No. 6,642,090.

Referring to FIG. 1, a semiconductor substrate 200 is formed. Hard mask patterns 224 are formed on the semiconductor substrate 200. The semiconductor substrate 200 is selectively etched using the hard mask patterns 224 as etching masks. As a result, portions of the semiconductor substrate 200 that are exposed by the hard mask patterns 224 are selectively recessed. The portions of the semiconductor substrate 200 that remain after the selective etching process is performed form fins 210. Trenches are formed on either side of each fin 210. Thereafter, the semiconductor substrate 200 including the fins 210 is subjected to an ion implantation process. The fins 210 are protected from the ion implantation due to the hard mask patterns 224 formed thereon. After the ion implantation process, the semiconductor substrate 200 is thermally oxidized to form oxide layers on bottom surfaces of the trenches between the fins 210. During the thermal oxidation process, oxide layers are also formed on sidewalls of the fins 210. The oxide layers on the bottom surfaces of the trenches may be about five times thicker than the oxide layers on the sidewalls of the fins 210. The thicker oxide layers form lower isolation layers 214. An inversion layer channel may be formed in a portion of each fin 210. The width of the inversion layer channel may be defined by the lower isolation layers 214. The oxide layers formed on the sidewalls of the fins 210 are then removed, and gate dielectric layers 220 are formed on the sidewalls of the fins 210. Gate electrodes 222 are then formed on sidewalls and upper surfaces of the fins 210. Drain regions (and drain electrodes) and source regions (and source electrodes) are respectively formed at opposite ends of the fins 210, thereby completing the FinFET.

When a sufficient voltage is applied to the gate electrode 222, an inversion layer channel is formed in the channel region of the fin 210, and current flows between the drain region and the source region. In other words, current flows through the wall-shaped fin 210 in a longitudinal direction. The channel region of the fin 210 may be formed to a width that is less than two times the maximum width of the depletion region. As such, when a voltage less than a threshold voltage of the device is applied to the gate electrode 222, the channel region may become completely depleted, which may improve susceptibility to short channel effects.

However, many semiconductor devices may include a cell array region and a peripheral circuit region in a single wafer. In some instances, it may be advantageous for the cell array region to include transistors, such as FinFETs, that have similar operational characteristics. The peripheral circuit region may include transistors having different operational characteristics. For example, some transistors may be used as differential amplifiers, while others may be used as drivers. In order to obtain such different operational characteristics, channel regions of different sizes may be required. For example, when the width of the channel region is more than twice the maximum depletion width for higher voltages, the channel region may not achieve a complete depletion state. Accordingly, a FinFET may be more susceptible to short channel effects as the width of the channel region (and therefore, the height of the fin) is increased.

SUMMARY OF THE INVENTION

According to some embodiments of the present invention, a method of forming an integrated circuit device may include forming a non-planar field-effect transistor selected from the group of a FinFET and a recessed gate FET in a cell array portion of a semiconductor substrate, and forming a planar field-effect transistor in a peripheral circuit portion of the semiconductor substrate. Dopants may be implanted into a channel region of the non-planar field-effect transistor, and then a cell protection layer may be formed on the non-planar field-effect transistor. Then, dopants may be selectively implanted into a channel region of the planar field-effect transistor using the cell protection layer as a mask to block implanting of the dopants into the channel region of the non-planar field-effect transistor.

In some embodiments, the non-planar field-effect transistor may be a FinFET, and forming the non-planar field-effect transistor may include forming a fin-shaped active region vertically protruding from the substrate.

In other embodiments, the non-planar field-effect transistor may be a recessed gate FET, and forming the non-planar field-effect transistor may include forming a trench in an active region in the cell array portion of the substrate.

In some embodiments, implanting dopants into the channel region of the non-planar field-effect transistor may include forming a mask layer on the non-planar and planar field-effect transistors. The mask layer may be selectively removed to expose at least a portion of the channel region of the non-planar field-effect transistor, and then dopants may be selectively implanted into the channel region of the non-planar field-effect transistor using the mask layer as an implantation mask and using an ion implantation process at a first implantation energy level.

In other embodiments, selectively implanting dopants into the channel region of the planar field-effect transistor may include selectively removing the mask layer to expose at least a portion of the channel region of the planar field-effect transistor. Then, dopants may be selectively implanted into the channel region of the planar field-effect transistor using the cell protection layer as an implantation mask and using an ion implantation process at a second implantation energy level that is different from the first implantation energy level.

In some embodiments, the cell protection layer may be formed of a plasma oxide layer, and the mask layer may include a silicon nitride polish stop layer and a silicon oxide hard mask layer stacked thereon.

In other embodiments, implanting dopants into the channel region of the non-planar field-effect transistor may include simultaneously implanting dopants into the channel regions of the planar and non-planar field-effect transistors using an ion implantation process at a first implantation energy level. In addition, selectively implanting dopants into the channel region of the planar field-effect transistor may include selectively implanting dopants into the channel region of the planar field-effect transistor using the cell protection layer as an implantation mask and using an ion implantation process at the first implantation energy level or at a second implantation energy level that is different from the first implantation energy level.

In some embodiments, the method of forming the integrated circuit device may further include forming a first gate dielectric layer on the channel region of the non-planar field-effect transistor after selectively implanting dopants into the channel region of the non-planar field-effect transistor and prior to forming the cell protection layer. A first gate conductive layer may then be formed on the channel region of the non-planar field-effect transistor to define an insulated cell gate electrode.

In other embodiments, forming a first gate conductive layer may include forming the first gate conductive layer on the planar and non-planar field-effect transistors, and then removing the first gate conductive layer from the planar field-effect transistor to define the insulated cell gate electrode.

In some embodiments, the method of forming the integrated circuit device may further include forming a second gate dielectric layer on the channel region of the planar field-effect transistor after selectively implanting dopants into the channel region of the planar field-effect transistor. A second gate conductive layer may be formed on the channel region of the planar field-effect transistor to define an insulated peripheral gate electrode.

In other embodiments, forming a second gate conductive layer may include forming the second gate conductive layer on the planar and non-planar field-effect transistors, and then removing the second gate conductive layer from the non-planar field-effect transistor to define the insulated peripheral gate electrode.

In some embodiments, removing the first gate conductive layer may include planarizing the first gate conductive layer to expose the planar field-effect transistor. Also, removing the second gate conductive layer may include planarizing the second gate conductive layer and the cell protection layer to expose the non-planar field-effect transistor.

In other embodiments, the first gate dielectric layer may be formed to a different thickness and/or of a different material than the second gate dielectric layer. The first and second gate dielectric layers may include one of a silicon oxide layer and a layer having a higher dielectric constant than the silicon oxide layer. The first gate dielectric layer may be formed of a silicon oxide layer using a thermal oxidization technique. Alternatively, the first gate dielectric layer may be formed of a high-k dielectric layer or a silicon oxide layer using an atomic layer deposition (ALD) technique. The second gate dielectric layer may be formed of a silicon oxide layer using a thermal oxidization technique. Alternatively, the second gate dielectric layer may be formed of a high-k dielectric layer or a silicon oxide layer using an atomic layer deposition (ALD) technique.

In some embodiments, an integrated circuit device may be formed according to the above method.

According to further embodiments of the present invention, a method of forming a semiconductor device may include preparing a semiconductor substrate having a cell region and a peripheral circuit region. A trench isolation layer may be formed in a predetermined region of the semiconductor substrate to define a cell active region in the cell region and a peripheral active region in the peripheral circuit region. The cell active region may have a width smaller than the peripheral active region. A mask layer may be formed on the trench isolation layer and the active regions and patterned to form a cell gate opening on the cell active region. The trench isolation layer may be etched using the patterned mask layer as an etch mask to form a cell gate groove partially exposing sidewalls and an upper surface of the cell active region. An insulated cell gate electrode may then be formed to fill the cell gate groove, and a cell gate protection layer may be formed on the cell gate electrode. The cell gate protection layer and the patterned mask layer may be etched to form a peripheral gate opening on the peripheral active region; and an insulated peripheral gate electrode may be formed in the peripheral gate opening.

According to still further embodiments of the present invention, a method of forming a semiconductor device may include preparing a semiconductor substrate having a cell region and a peripheral circuit region. A trench isolation layer may be formed in a predetermined region of the semiconductor substrate to define a cell active region in the cell region and a peripheral active region in the peripheral circuit region. The cell active region may have a width smaller than the peripheral active region. A mask layer may be formed on the trench isolation layer and the active regions and patterned to form a cell gate opening on the cell active region. The cell active region may be etched using the patterned mask layer as an etch mask to form a cell gate groove which partially recesses the cell active region, and an insulated cell gate electrode may be formed to fill the cell gate groove. A cell gate protection layer may be formed on the cell gate electrode. The cell gate protection layer and the patterned mask layer may be etched to form a peripheral gate opening on the peripheral active region, and an insulated peripheral gate electrode may be formed in the peripheral gate opening.

DETAILED DESCRIPTION OF EMBODIMENTS OF THE INVENTION

Figure 1:
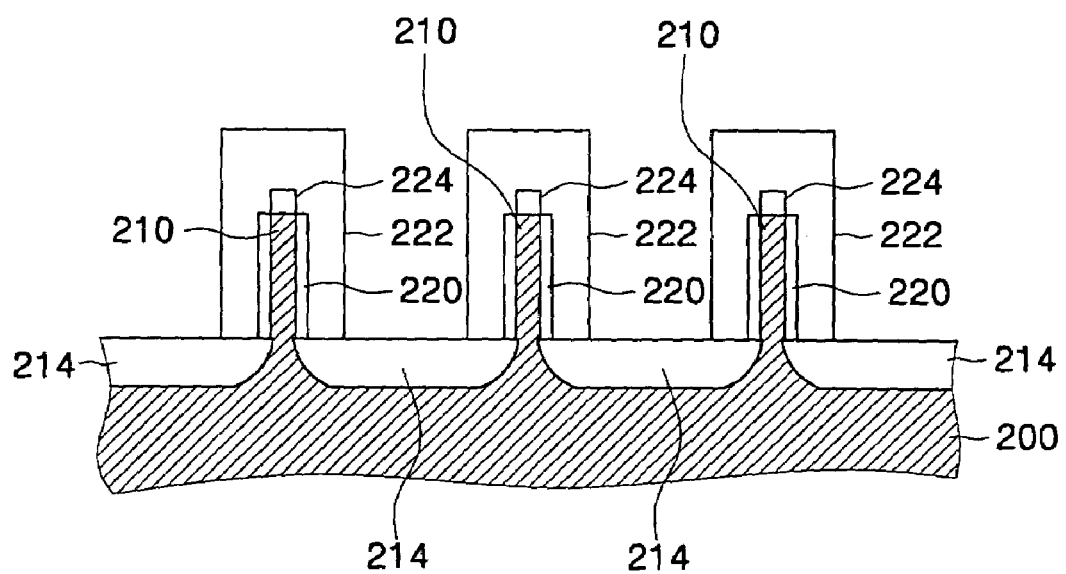
FIG. 1 is a cross-sectional view illustrating conventional methods of fabricating a FinFET.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 2:
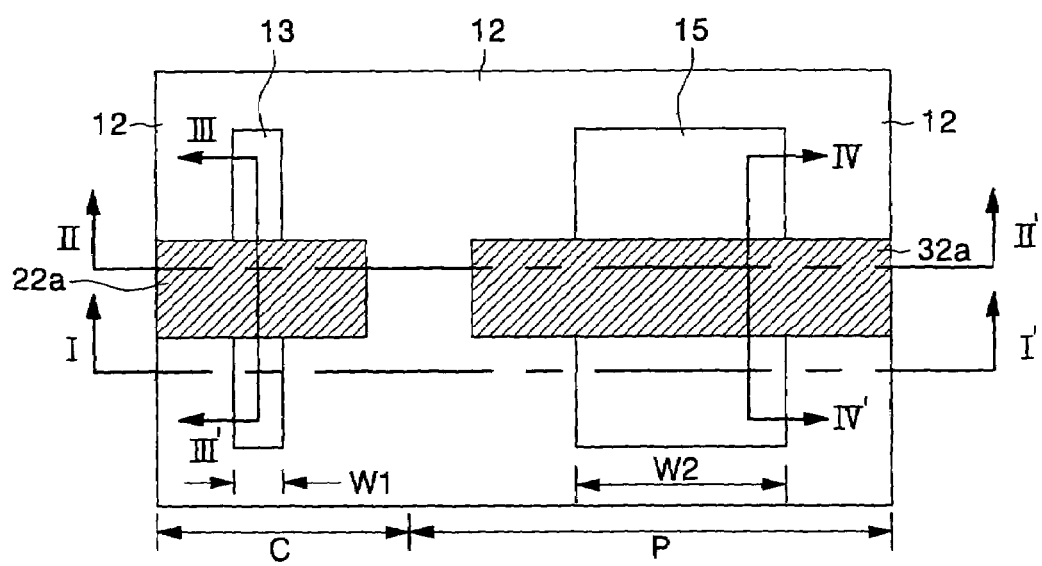
FIG. 2 is a plan view of semiconductor devices according to some embodiments of the present invention.
Figure 3A:
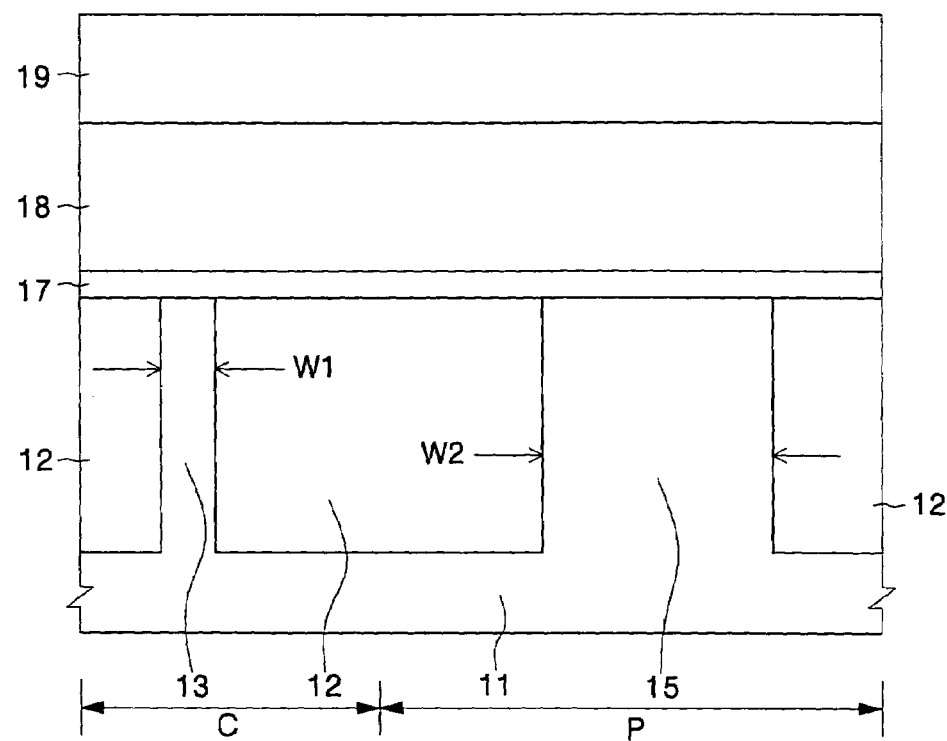
FIGS. 3A to 11D are cross-sectional views illustrating exemplary operations for forming semiconductor devices according to some embodiments of the present invention.
Figure 3B:
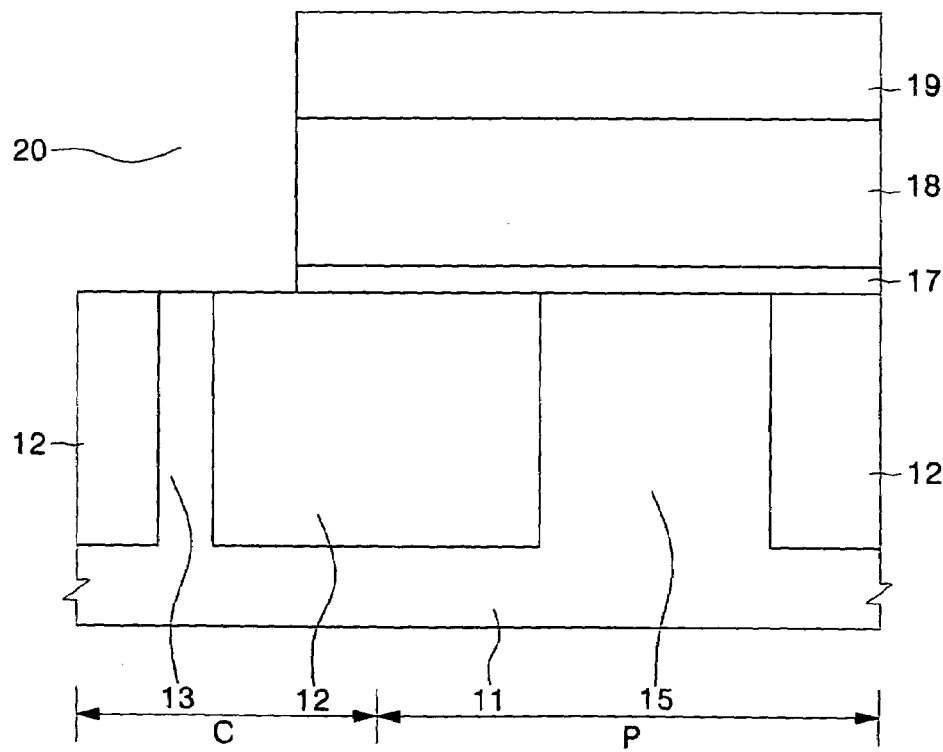
Figure 3C:
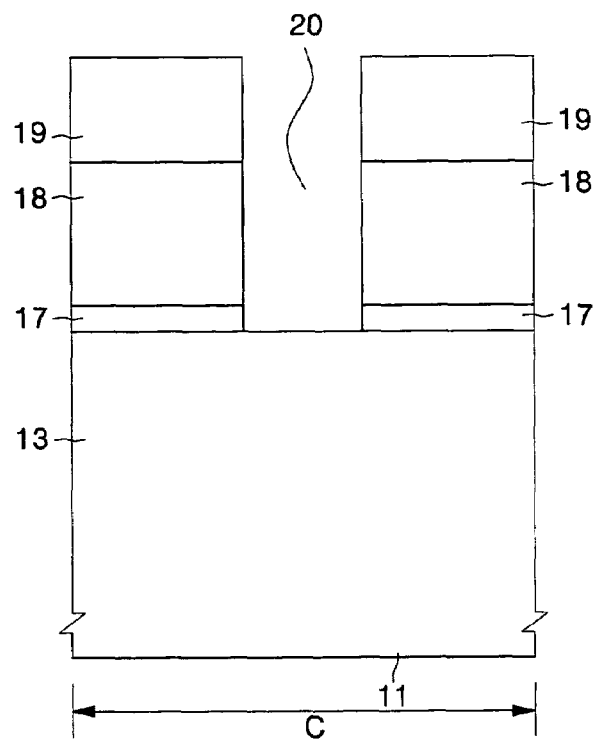
Figure 3D:
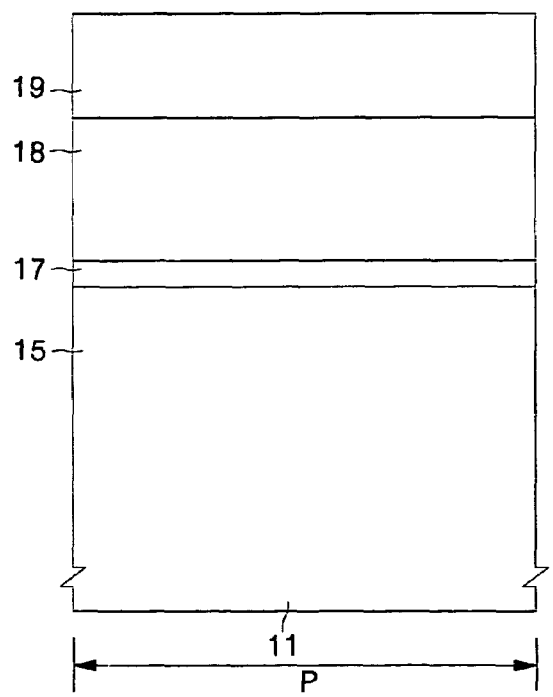
Figure 4A:
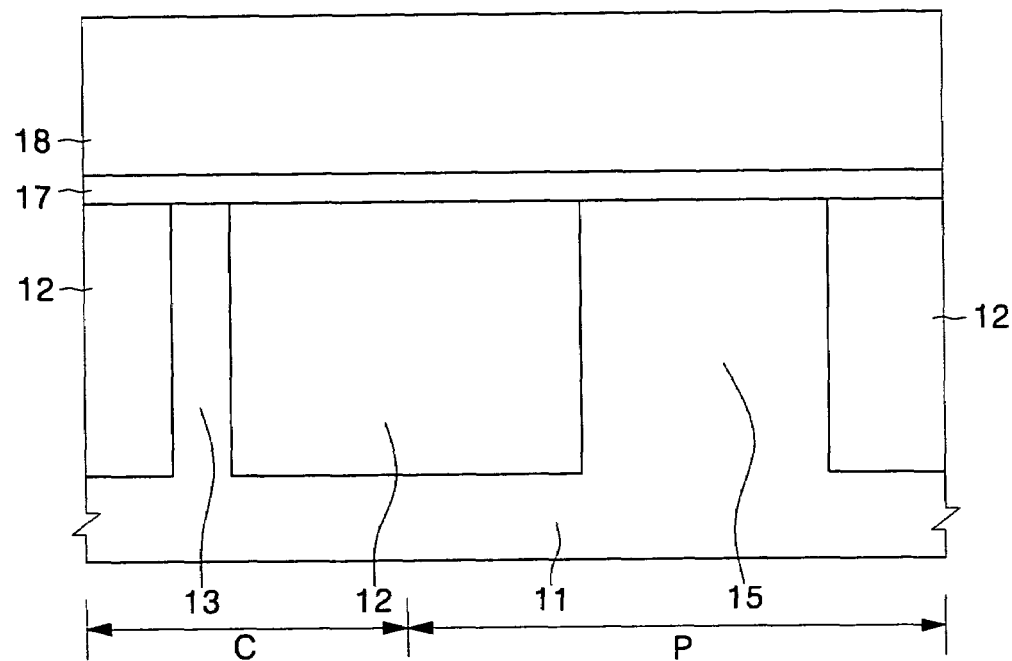
Figure 4B:
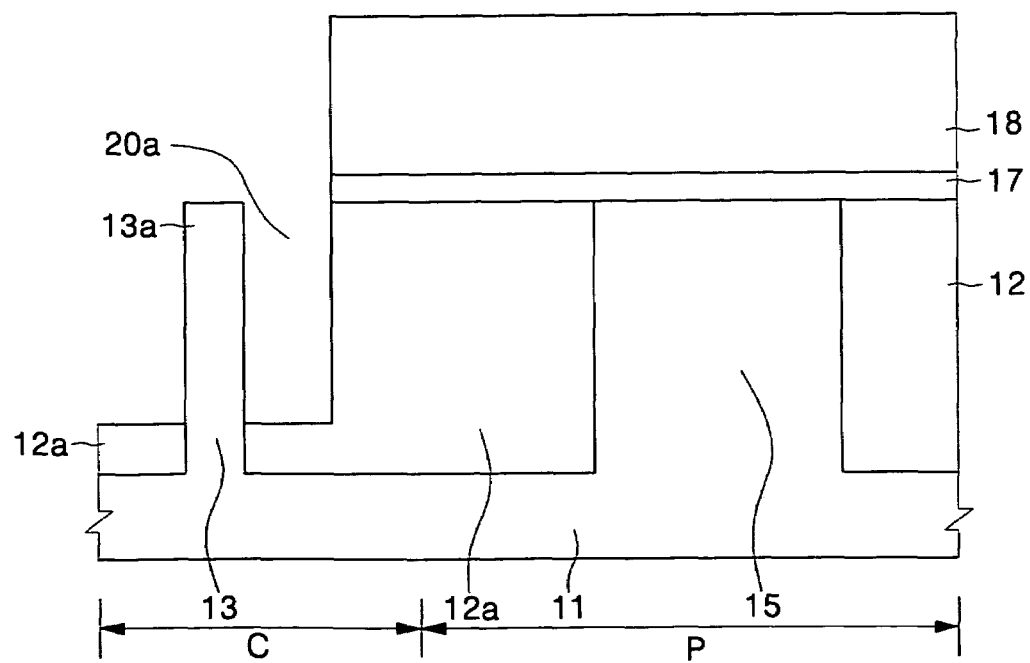
Figure 4C:
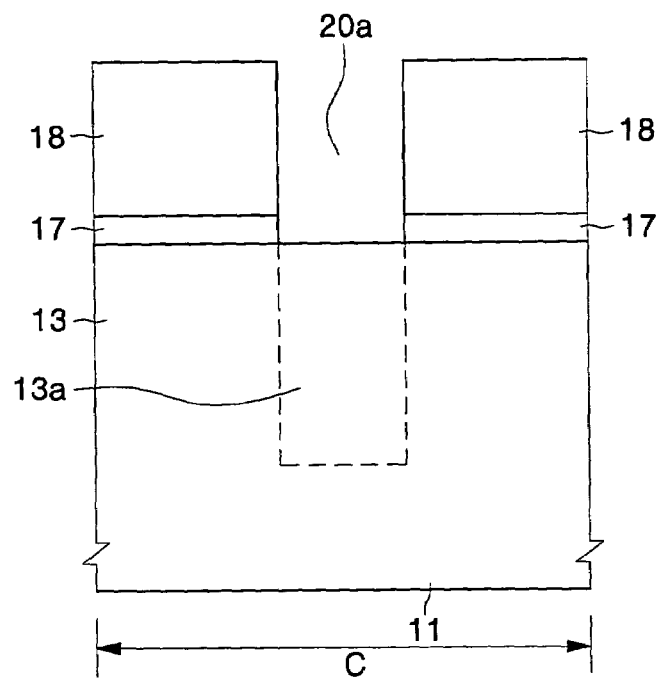
Figure 4D:
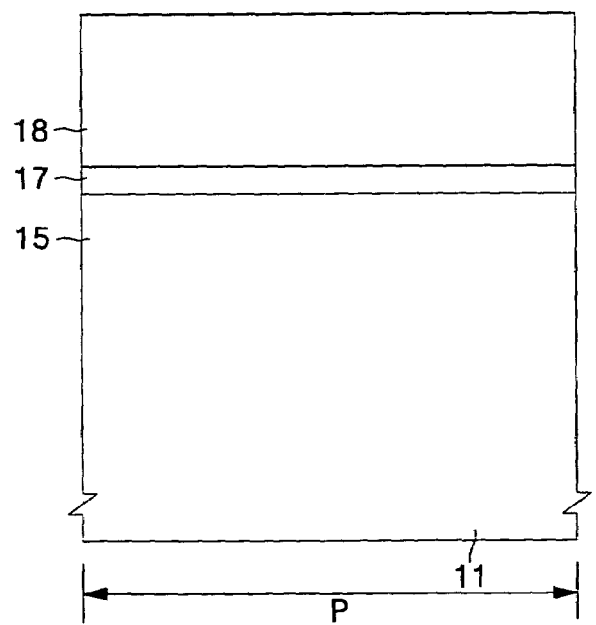
Figure 5A:
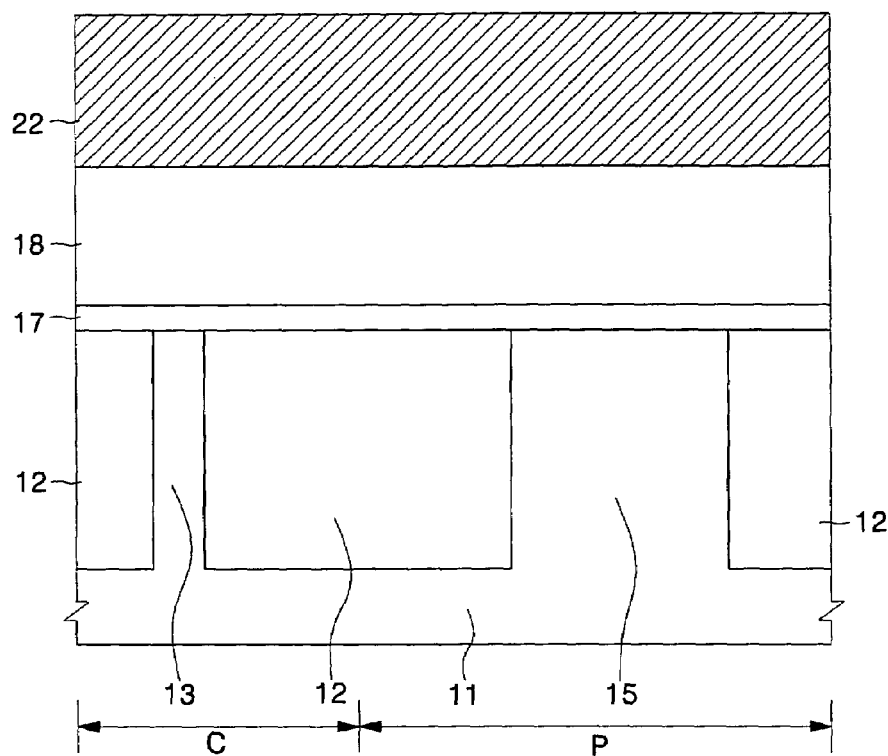
Figure 5B:
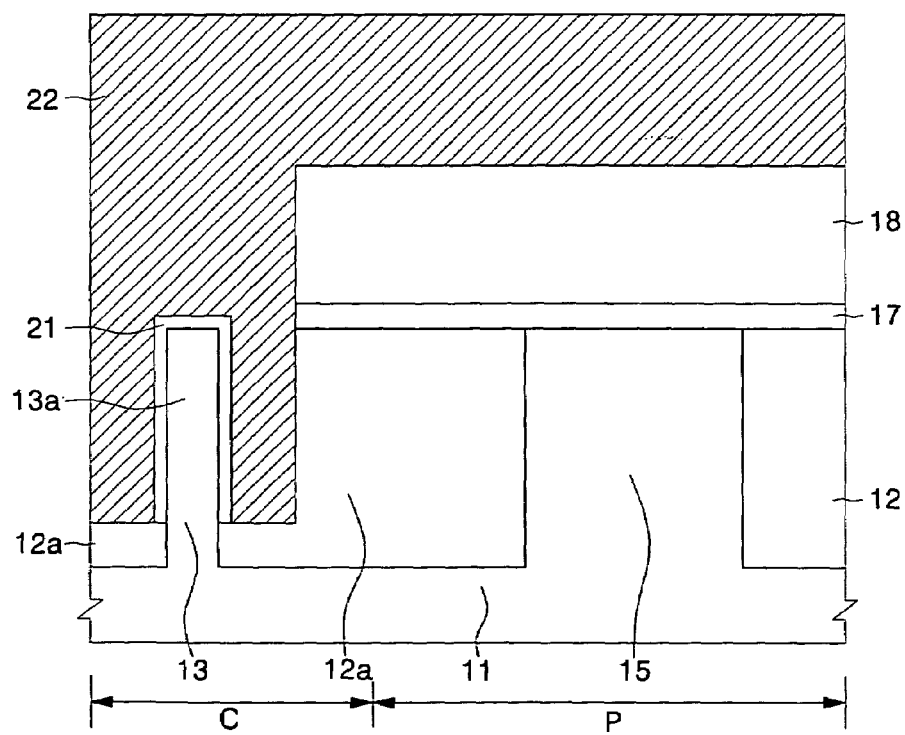
Figure 5C:
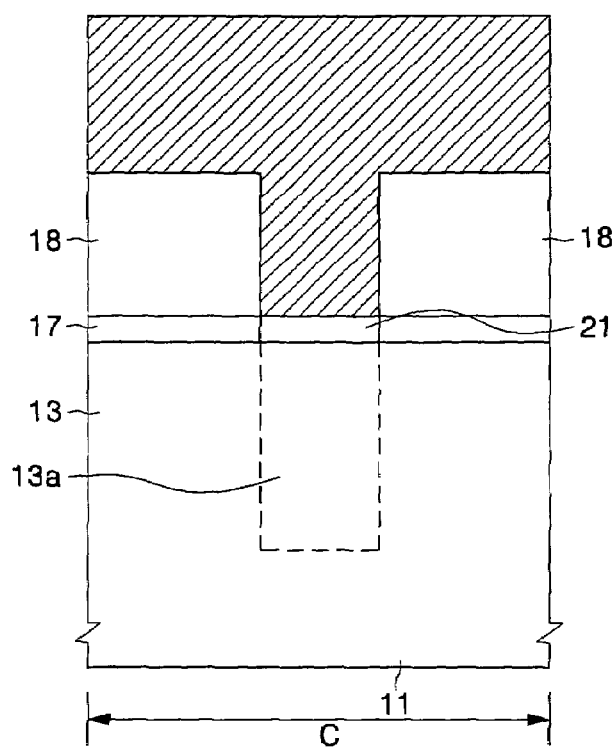
Figure 5D:
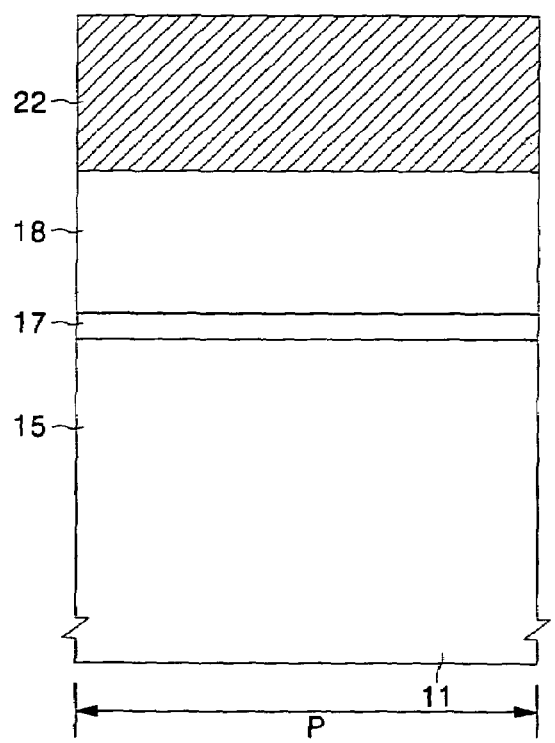
Figure 6A:
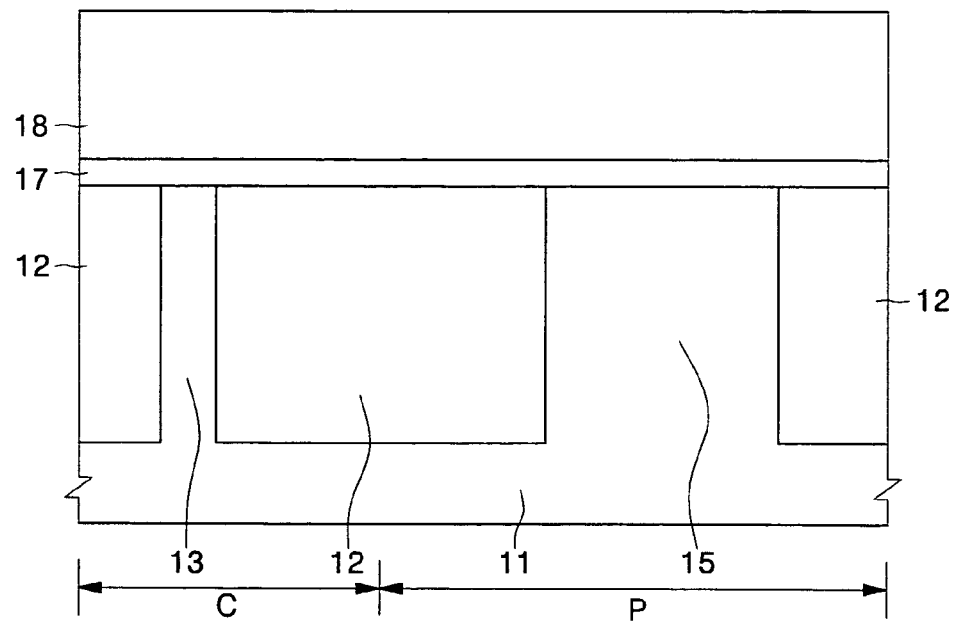
Figure 6B:
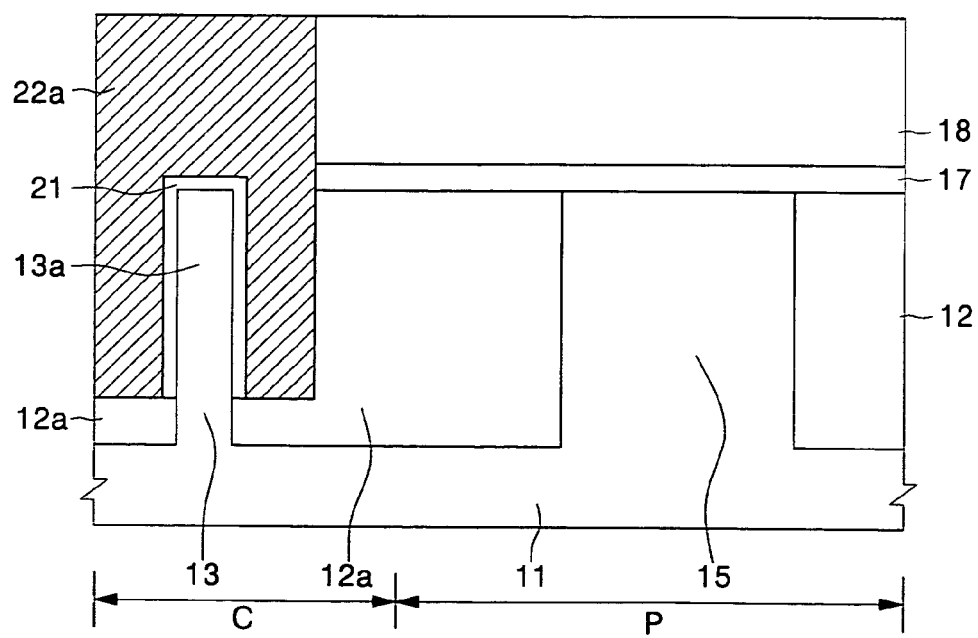
Figure 6C:
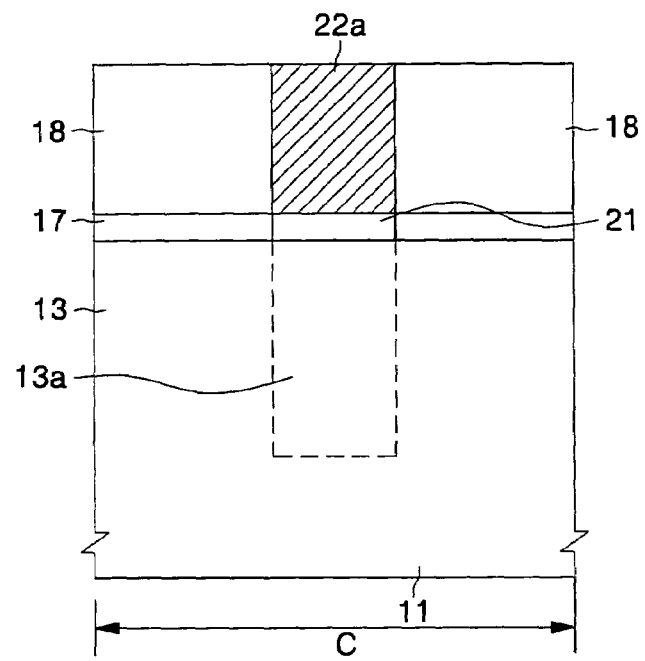
Figure 6D:
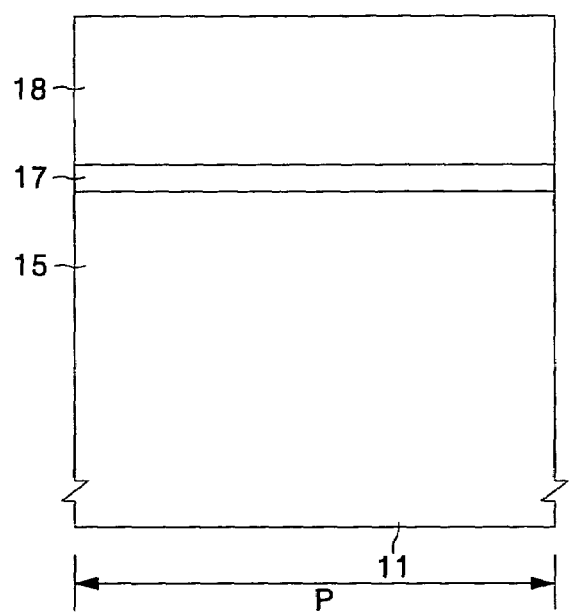
Figure 7C:
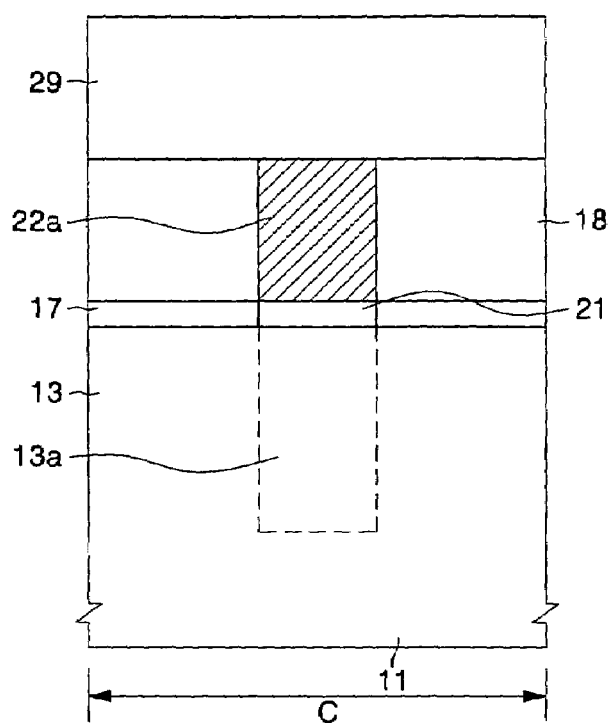
Figure 7D:
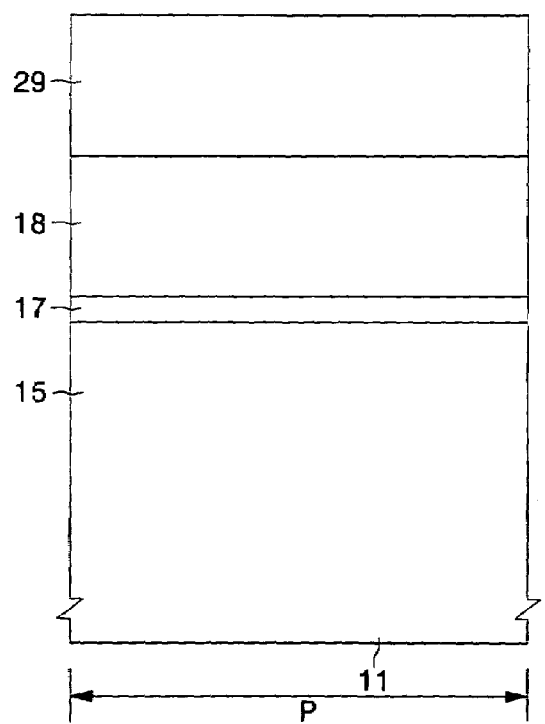
Figure 8A:
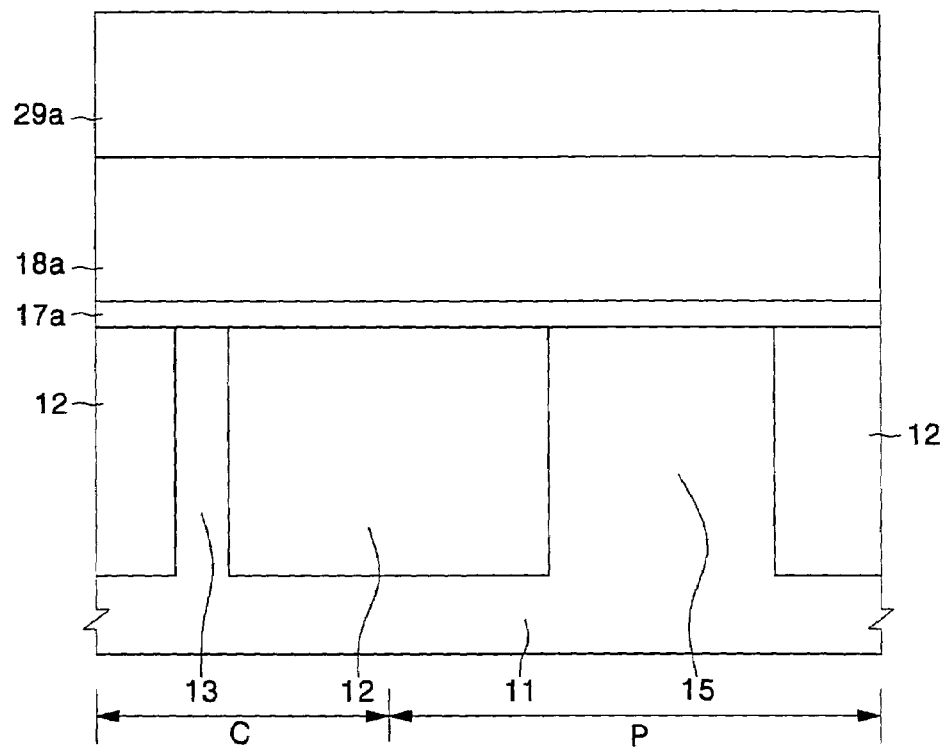
Figure 8B:
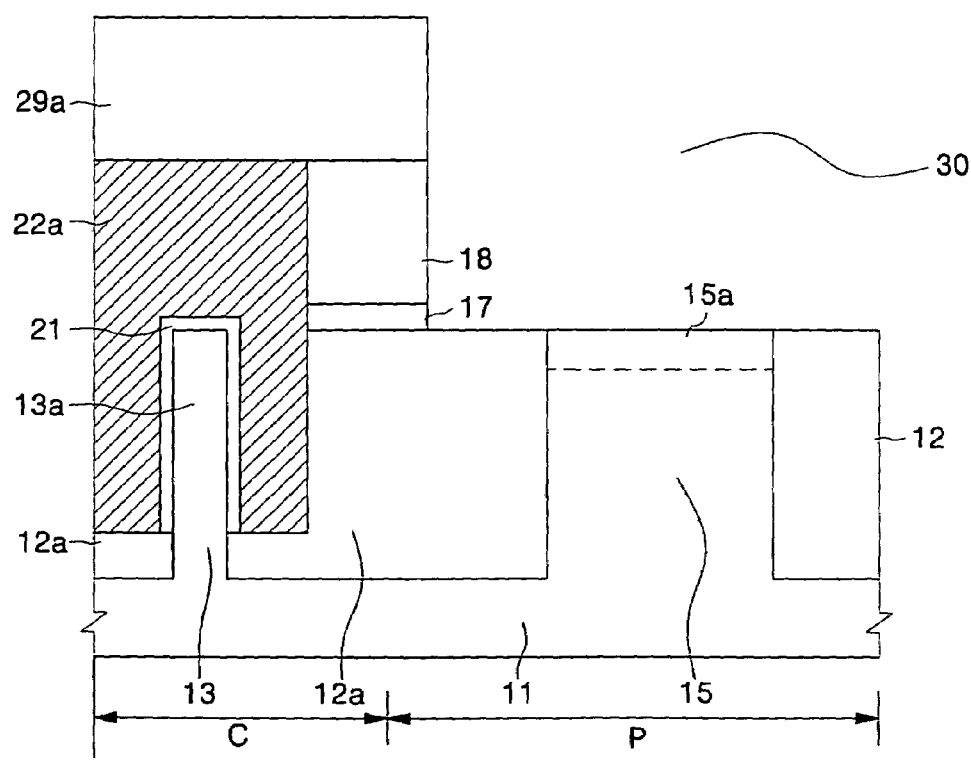
Figure 8C:
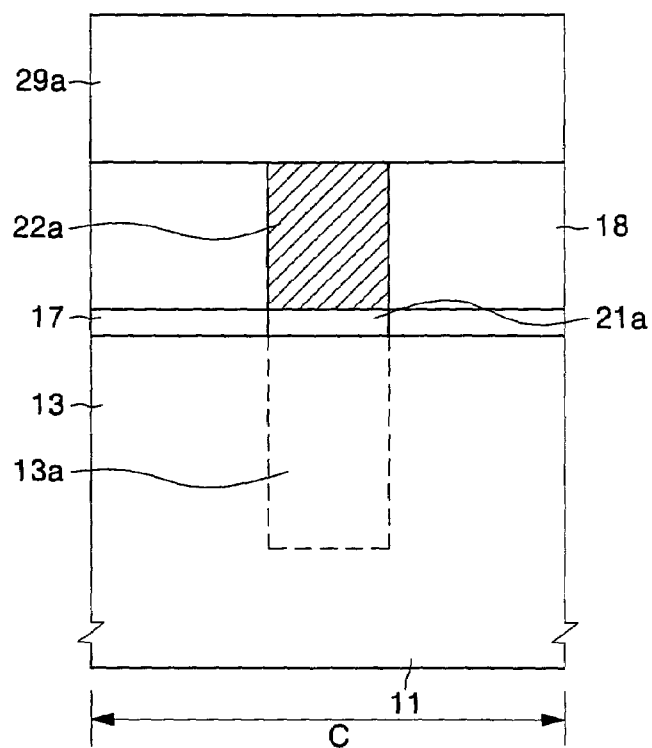
Figure 8D:
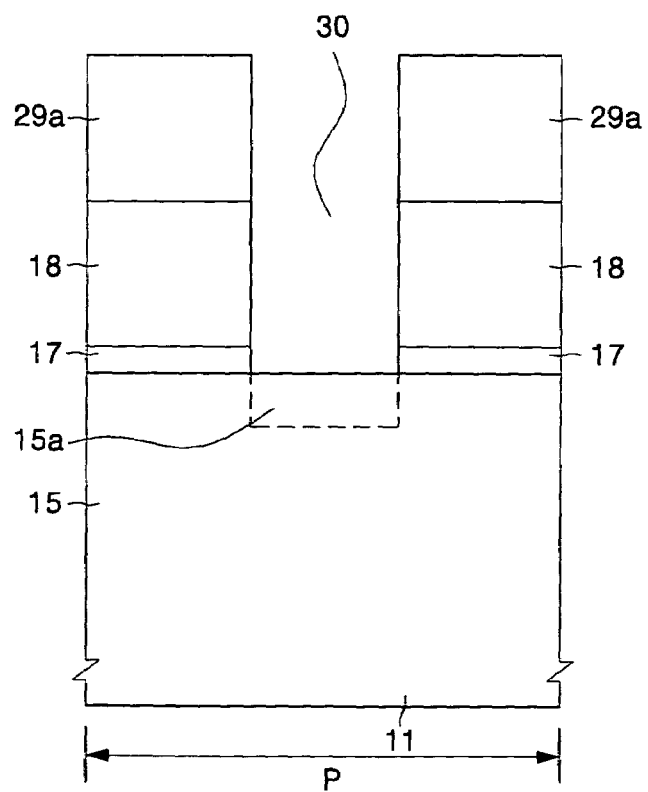
Figure 9A:
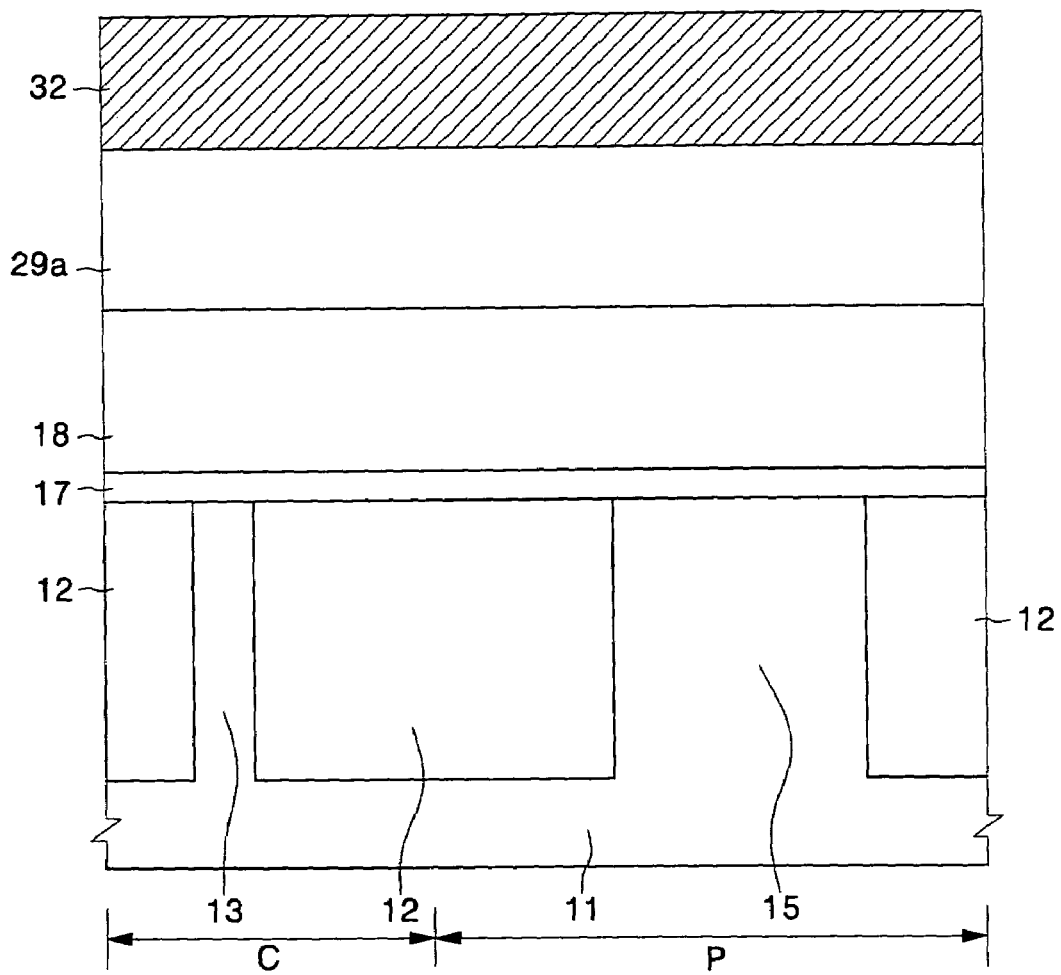
Figure 9B:
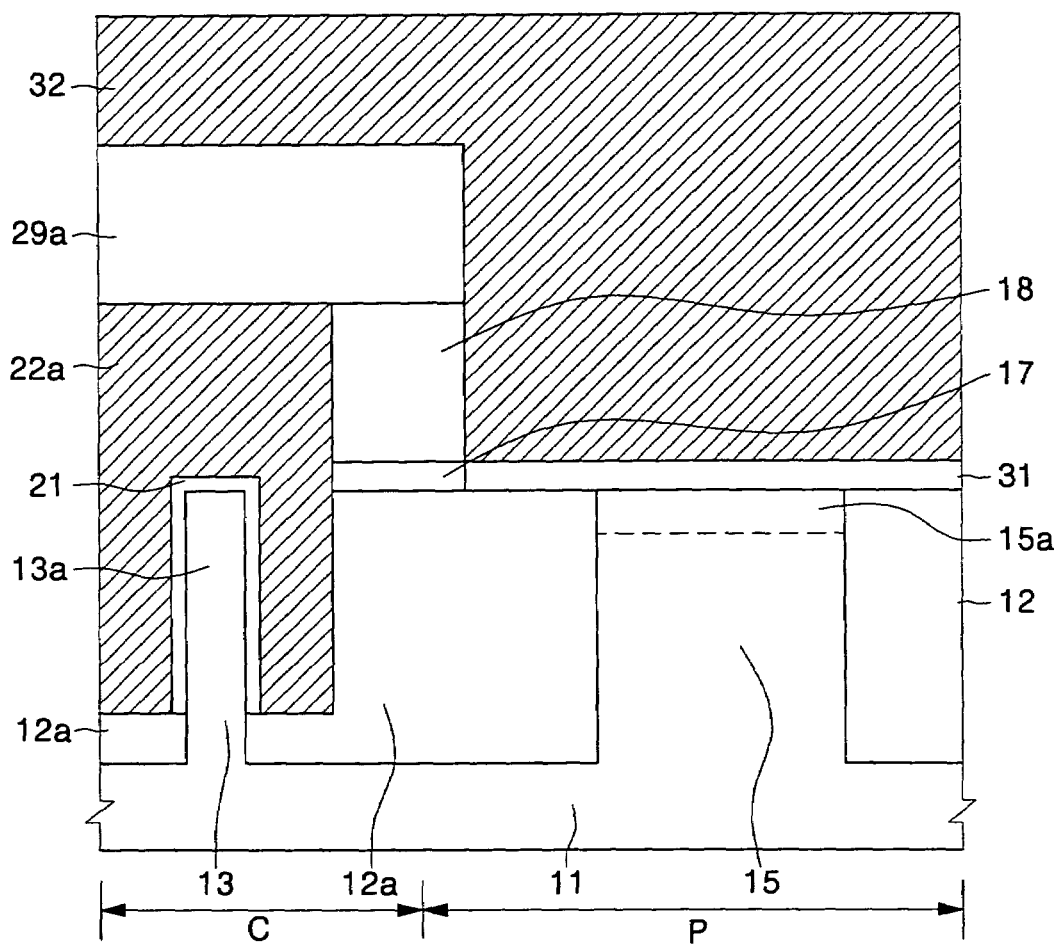
Figure 9C:
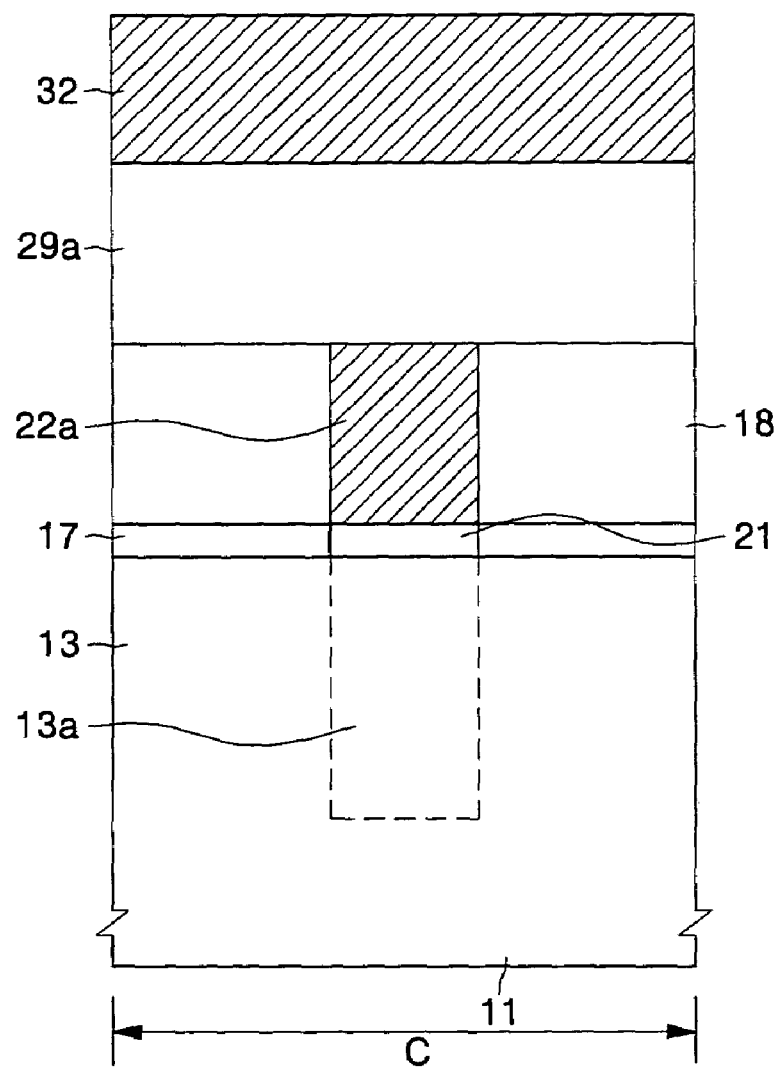
Figure 9D:
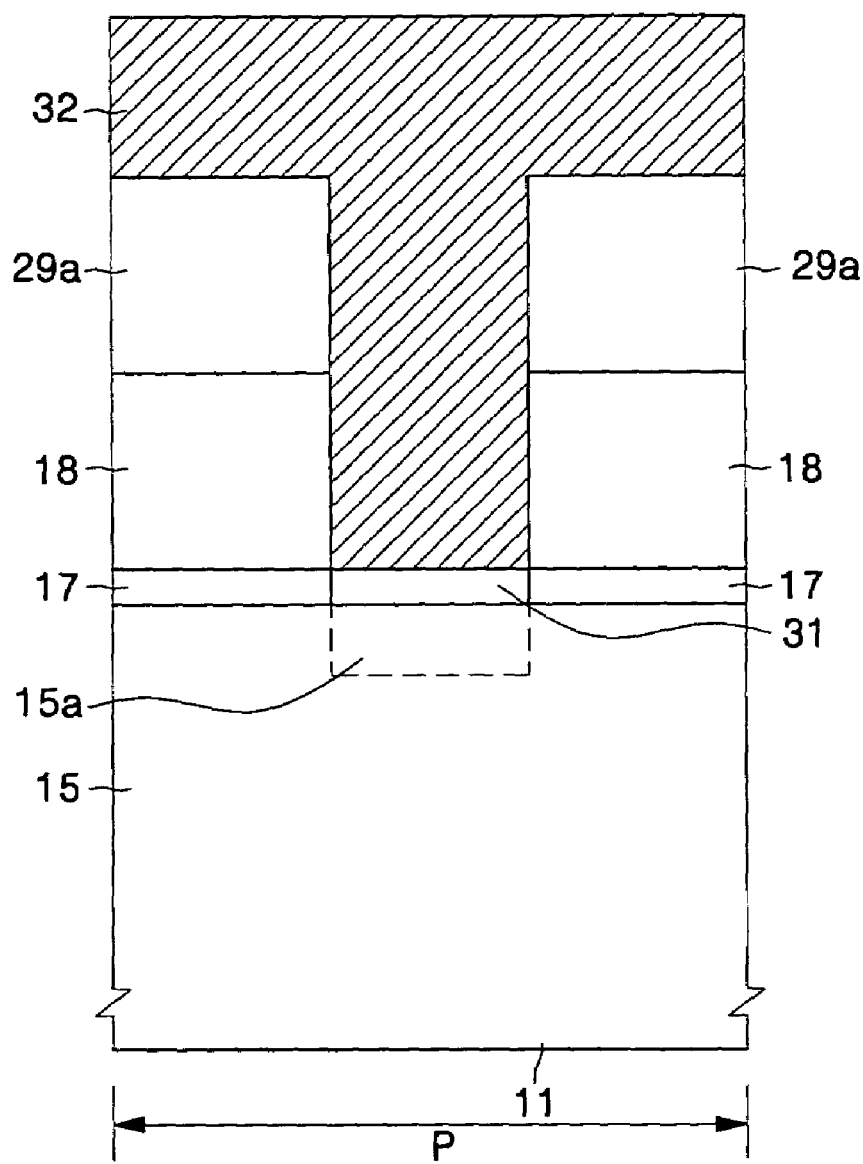
Figure 10A:
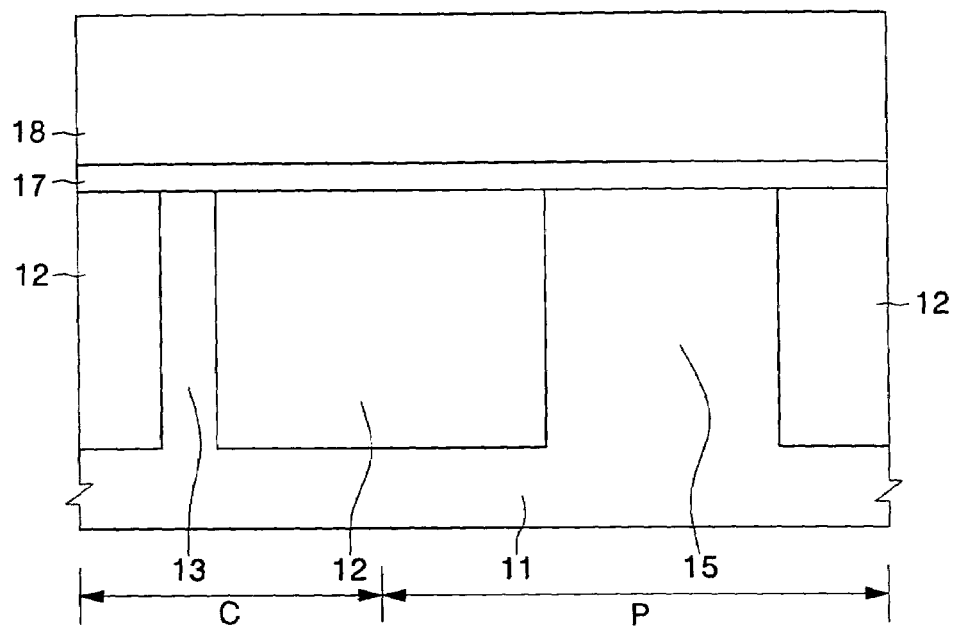
Figure 10B:
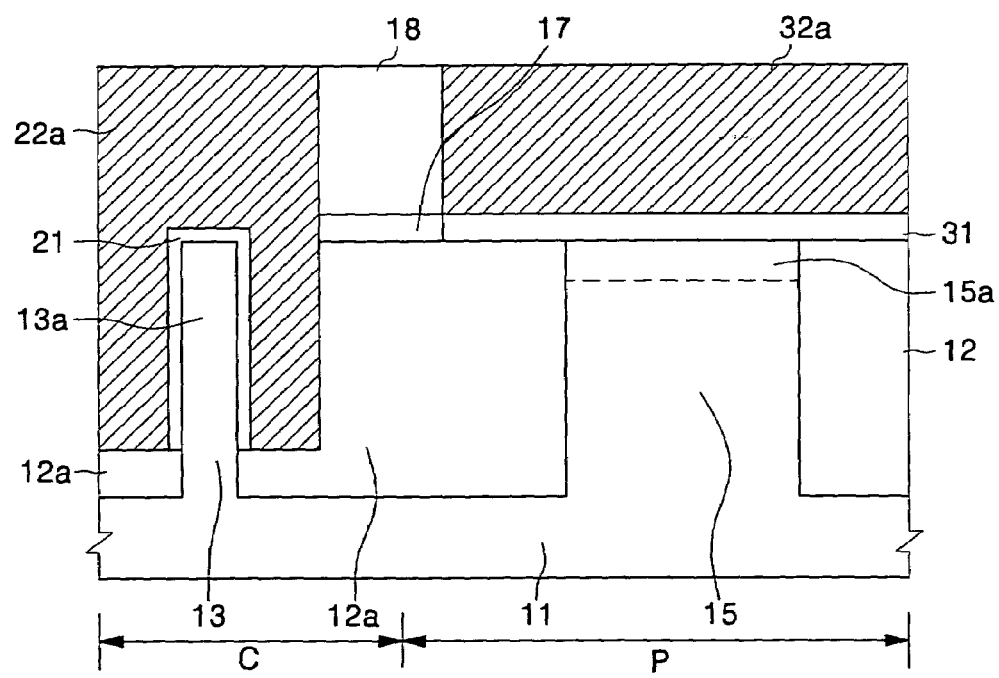
Figure 10C:
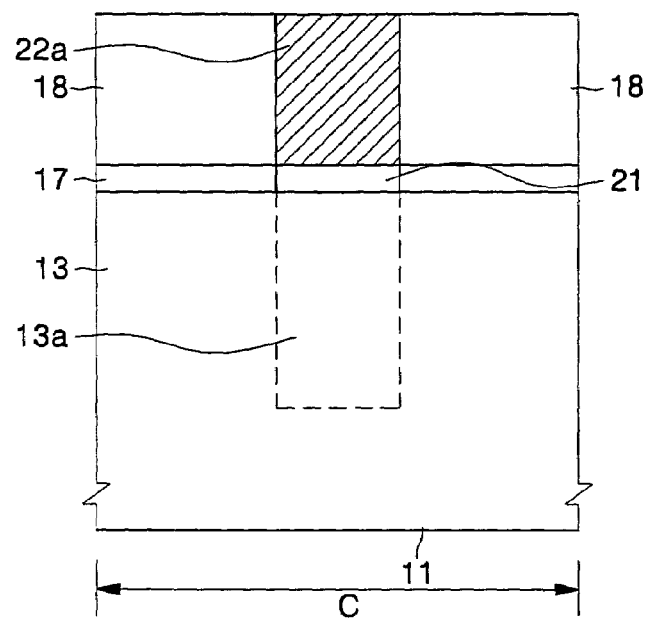
Figure 10D:
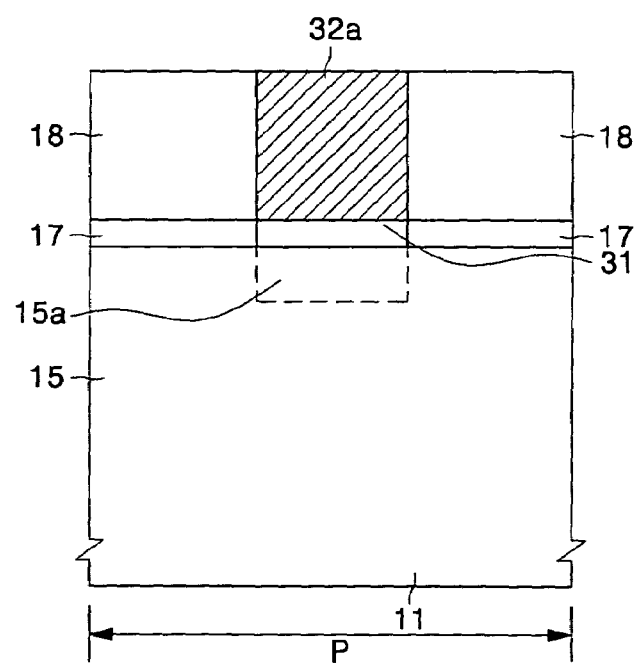
Figure 11A:
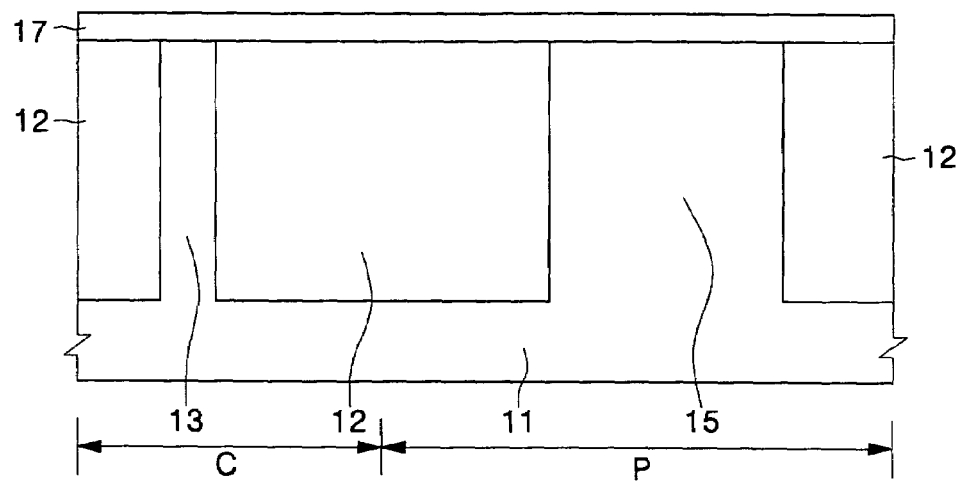
Figure 11B:
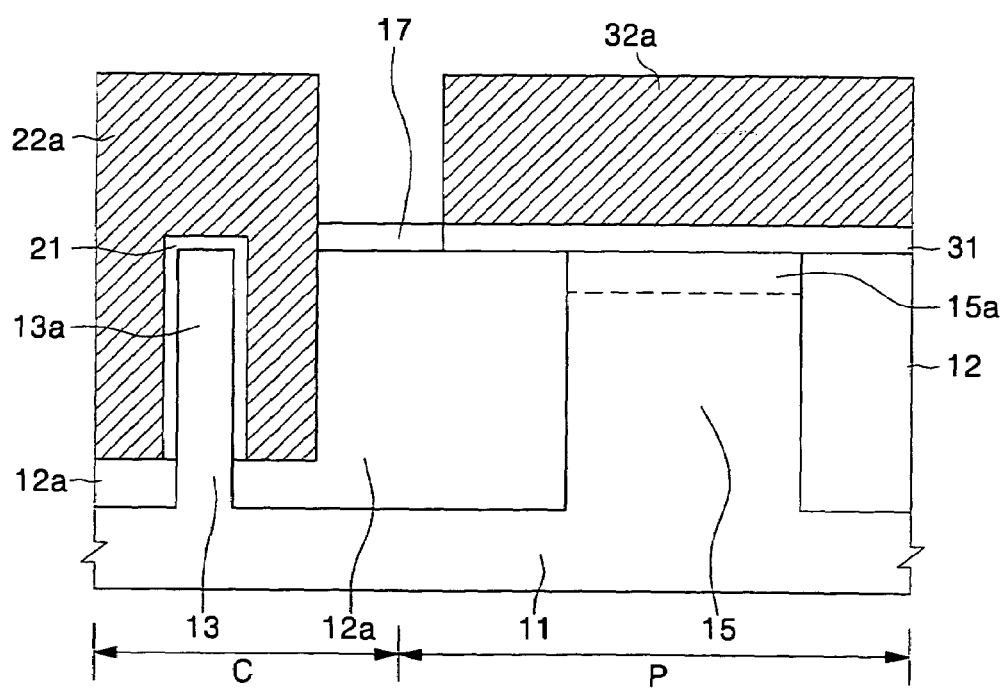
Figure 11C:
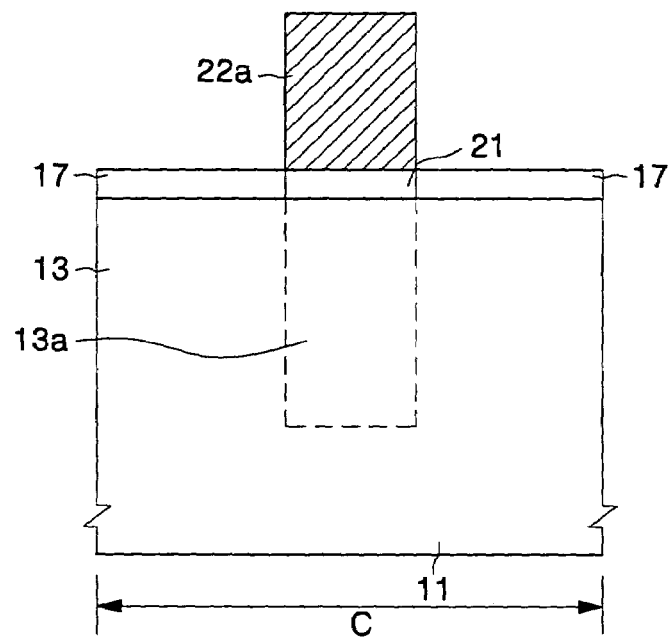
Figure 11D:
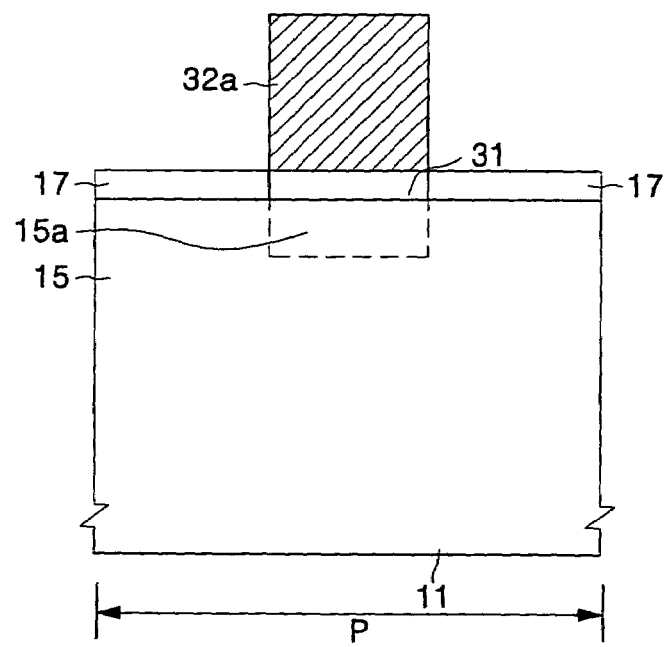

FIG. 2 is a plan view of semiconductor devices according to some embodiments of the present invention, and FIGS. 3A to 11D are cross-sectional views illustrating exemplary operations for forming semiconductor devices according to some embodiments of the present invention. More specifically, FIGS. 3A to 11A are cross-sectional views taken along line I-I' of FIG. 2, and FIGS. 3B to 11B are cross-sectional views taken along line II-II' of FIG. 2. FIGS. 3C to 11C are cross-sectional views taken along line III-III' of FIG. 2, and FIGS. 3D to 11D are cross-sectional views taken along line IV-IV' of FIG. 2. In the drawings, reference designators "C" and "P" denote cell regions and peripheral circuit regions, respectively.

Referring now to FIGS. 2 and 3A to 3D, a predetermined region of a semiconductor substrate 11 is selectively etched to form a trench region. The trench region defines a cell active region 13 in cell array region C and a peripheral active region 15 in peripheral circuit region P. The cell active region 13 is formed to have a first width W1, and the peripheral active region 15 is formed to have a second width W2 that is greater than the first width W1. A trench isolation layer 12 is formed in the trench region using conventional techniques. The trench isolation layer 12 may be a high-density plasma oxide layer having excellent gap-filling characteristics.

The peripheral active region 15 may be formed to be suitable for planar transistors. As used herein, planar transistors may include transistors having source, drain, and channel regions formed in the plane of a substrate surface, and a gate electrode formed on the substrate surface. In embodiments of the present invention, planar transistors may be used, for example, as differential amplifiers and/or drivers. In contrast, the cell active region 13 may be formed to be suitable for non-planar transistors, such as for use as memory cells. As used herein, non-planar transistors may include transistors such as FinFETs, recessed gate transistors, and/or other transistor types that may not be planar transistors.

A mask layer is then formed on the semiconductor substrate 11 including the trench isolation layer 12. The mask layer includes a polish stop layer 18 and a hard mask layer 19 which are sequentially stacked on the semiconductor substrate 11 including the trench isolation layer 12. The polish stop layer 18 may be a silicon nitride layer, and the hard mask layer 19 may be a silicon oxide layer. Before the polish stop layer 18 is formed, a buffer layer 17 may be formed on the substrate 11. The buffer layer 17 may relieve physical stress between the polish stop layer 18 and the active regions 13 and 15. The buffer layer 17 may be formed of a silicon oxide layer, such as a thermal oxide layer.

The mask layer is then patterned to form a cell gate opening 20 which crosses over the cell active region 13. As such, the patterned mask layer includes the buffer layer 17, the polish stop layer 18, and the hard mask layer 19. The cell gate opening 20 crosses over a portion of the cell active region 13 and extends to upper surfaces of the trench isolation layers 12 adjacent each side of the cell active region 13.

Referring now to FIGS. 2 and 4A to 4D, the trench isolation layer 12 is dry etched using the patterned mask layer as an etching mask. The dry etching process may have an etching selectivity between silicon, which forms the cell active region 13, and silicon oxide, which forms the trench isolation layer 12. As a result, a portion 12a of the trench isolation layer 12 that is exposed by the cell gate opening 20 is recessed to form a cell gate groove 20a. A fin having a cell channel region 13a is thereby defined in the cell active region 13 by the cell gate groove 20a. The hard mask layer 19 may also be removed at this time.

Dopants may be introduced into the semiconductor substrate 11 including the cell channel region 13a, for example, by ion implantation. Since the remaining portion of the cell active region 13 (other than the cell channel region 13a) and the peripheral active region 15 are covered by the mask layer, ions are not implanted into the cell active region 13 and/or the peripheral active region 15. In other words, the cell channel region 13a is selectively doped using the mask layer as an implantation mask. Ions may be implanted into the cell channel region 13a at various angles using various ion implantation energies.

Referring now to FIGS. 2 and 5A to 5D, a cell gate dielectric layer 21 is formed on an upper surface and sidewalls of the fin including the cell channel region 13a. The cell gate dielectric layer 21 may be a silicon oxide layer formed by a thermal oxidation technique. Alternatively, the cell gate dielectric layer 21 may be a silicon oxide layer or a high-k dielectric layer formed by an atomic layer deposition (ALD) technique. A cell gate conductive layer 22 is then formed on the semiconductor substrate 11 including the cell gate dielectric layer 21. The cell gate conductive layer 22 may be a polysilicon layer.

Referring to FIGS. 2 and 6A to 6D, the cell gate conductive layer 22 is planarized to form a cell gate electrode 22a. The planarization process may be performed using a chemical mechanical polishing (CMP) technique which may employ the polish stop layer 18 as a stopper.

Referring to FIGS. 2 and 7A to 7D, a cell gate protection layer 29 is formed on the semiconductor substrate 11 including the cell gate electrode 22a. The cell gate protection layer 29 is deposited to cover the cell gate electrode 22a and the polish stop layer 18. The cell gate protection layer 29 may be formed of a high density plasma oxide layer.

Referring to FIGS. 2 and 8A to 8D, the cell gate protection layer 29 is patterned to form a cell gate protection layer pattern 29a covering the cell gate electrode 22a and a portion of the polish stop layer 18. Then, the exposed portion of the polish stop layer 18 is etched using the cell gate protection layer pattern 29a as an etch mask to thereby form a peripheral gate opening 30. The peripheral gate opening 30 defines a peripheral channel region 15a which crosses over a portion of the peripheral active region 15. As such, an upper surface of the peripheral channel region 15a is exposed.

Dopants may be introduced into the semiconductor substrate 11 including the peripheral channel region 15a, for example, using ion implantation. Ions may be implanted into the peripheral channel region 15a through the peripheral gate opening 30.

Since the remaining portion of the peripheral active region 15 (other than the peripheral channel region 15a) and the cell active region 13 are covered by the cell gate protection layer pattern 29a, ions are not implanted into the peripheral active region 15 and the cell active region 13. In other words, the peripheral channel region 15a may be selectively doped using the cell protection layer 29a as an implantation mask to block implanting of dopants into the cell active region 13. Ions may be implanted into the peripheral channel region 15a at various angles using various ion implantation energies. For example, ions may be implanted into the peripheral channel region 15a at a different implantation energy level than used for the cell channel region 13a. As such, the cell and peripheral channel regions 13a and 15a may have different carrier concentrations.

Referring now to FIGS. 2 and 9A to 9D, a peripheral gate dielectric layer 31 is formed on the exposed portion of the peripheral channel region 15a. The peripheral gate dielectric layer 31 may be a silicon oxide layer formed by thermal oxidation. Alternatively, the peripheral gate dielectric layer 31 may be a silicon oxide layer or a high-k dielectric layer formed by an ALD technique. The peripheral gate dielectric layer 31 may have a different thickness than the cell gate dielectric layer 21, which may be suitable for a peripheral circuit. A peripheral gate conductive layer 32 is formed on the semiconductor substrate 11 including the peripheral gate dielectric layer 31. The peripheral gate conductive layer 32 may be a polysilicon layer.

Referring to FIGS. 2 and 10A to 10D, the peripheral gate conductive layer 32 is planarized to form a peripheral gate electrode 32a. The planarization process may be performed using a CMP technique which employs the polish stop layer 18 as a stopper. At this time, the cell gate protection layer pattern 29a may also be removed. As a result, upper surfaces of the peripheral gate electrode 32a and the cell gate electrode 22a are exposed.

Referring to FIGS. 2 and 11A to 11D, the polish stop layer 18 is etched to form an insulated cell gate electrode 22a in cell array region C and an insulated peripheral gate electrode 32a in peripheral circuit region P. During the etching of the polish stop layer 18, the cell active region 13 and the peripheral active region 15 (which may be covered by the buffer layer 17) are protected from etching damage.

Subsequently, source and drain regions (not shown) are formed in the cell active region 13 and the peripheral active region 15 using the cell gate electrode 22a and the peripheral gate electrode 32a as a mask, and then an interlayer insulating layer is formed. Finally, source and drain electrodes are formed on the respective source and drain regions. As a result, a FinFET is formed in the cell array region C, and a planar FET is formed in the peripheral circuit region P.

FIGS. 12 to 20 are cross-sectional views illustrating exemplary operations for forming semiconductor devices according to other embodiments of the present invention. In the drawings, reference designations "C" and "P" denote cell array regions and peripheral circuit regions, respectively.

Figure 12:
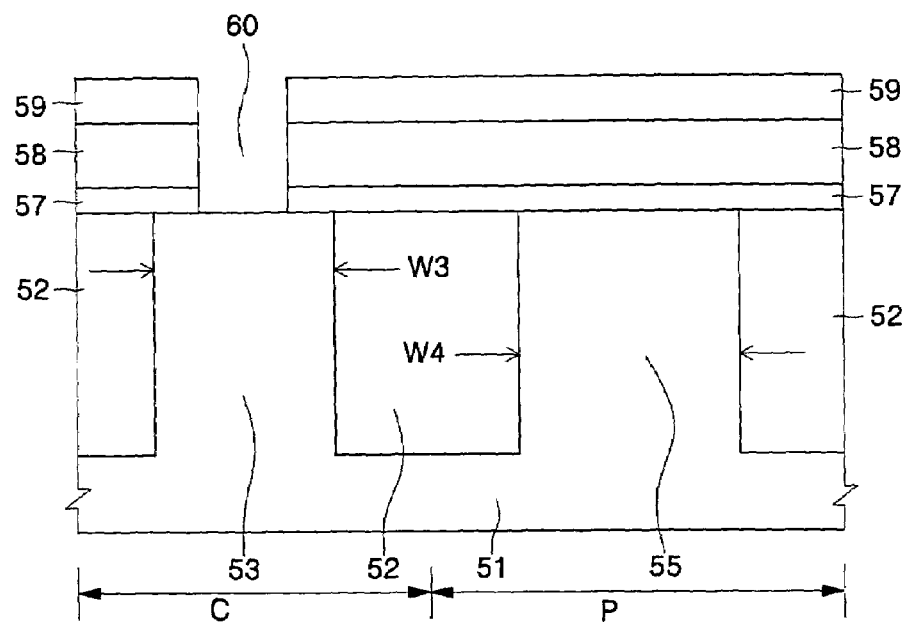
FIGS. 12 to 20 are cross-sectional views illustrating exemplary operations for forming semiconductor devices according to other embodiments of the present invention.

Referring now to FIG. 12, a predetermined region of a semiconductor substrate 51 is selectively etched to form a trench region. The trench region defines a cell active region 53 in the cell array region C and a peripheral active region 55 in the peripheral circuit region P. The cell active region 53 is formed to have a third width W3, and the peripheral active region 55 is formed to have a fourth width W4 that is greater than the third width W3. A trench isolation layer 52 is formed in the trench region using conventional techniques. The trench isolation layer 52 may be formed of a high density plasma oxide layer having excellent gap filling characteristics.

Dopants may then be introduced into the semiconductor substrate 51 including the trench isolation layer 52, such as by ion implantation. In other words, ions may be simultaneously implanted into the cell active region 53 and the peripheral active region 55.

A mask layer is then formed on the semiconductor substrate 51 including the trench isolation layer 52. The mask layer includes a polish stop layer 58 and a hard mask layer 59 which are sequentially stacked on the semiconductor substrate 51 including the trench isolation layer 52. The polish stop layer 58 may be a silicon nitride layer, and the hard mask layer 59 may be a silicon oxide layer. Before the polish stop layer 58 is formed, a buffer layer 57 may be formed. The buffer layer 57 may relieve physical stress between the polish stop layer 58 and the active regions 53 and 55. The buffer layer 57 may be a silicon oxide layer, such as a thermal oxide layer.

The mask layer is then patterned to form a cell gate opening 60 above the cell active region 53. As such, the buffer layer 57, the polish stop layer 58, and the hard mask layer 59 are sequentially patterned.

Figure 13:
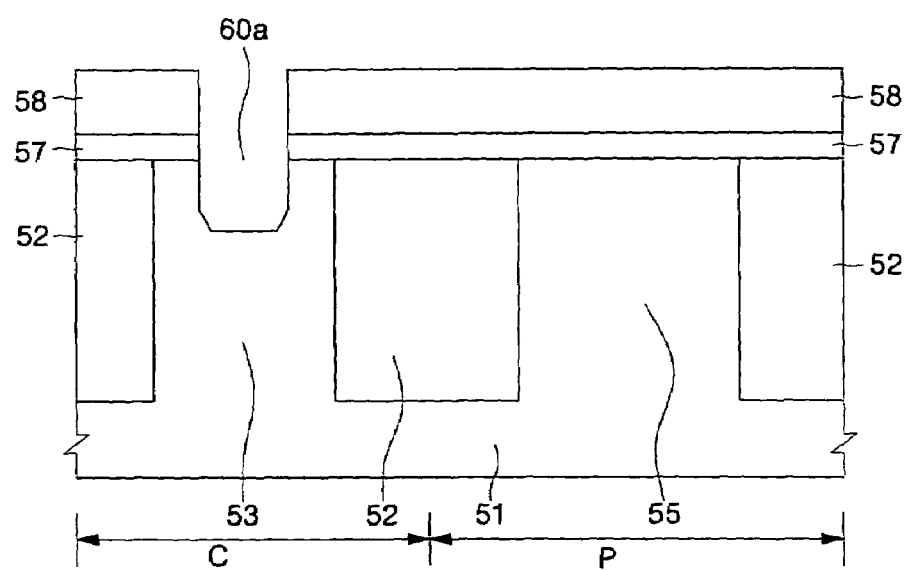

Referring now to FIG. 13, the cell active region 53 is etched using the patterned mask layer as an etch mask to form a cell gate groove 60a. As a result, a portion of the cell active region 53 is recessed. At this time, the hard mask layer 59 may also be removed.

Figure 14:
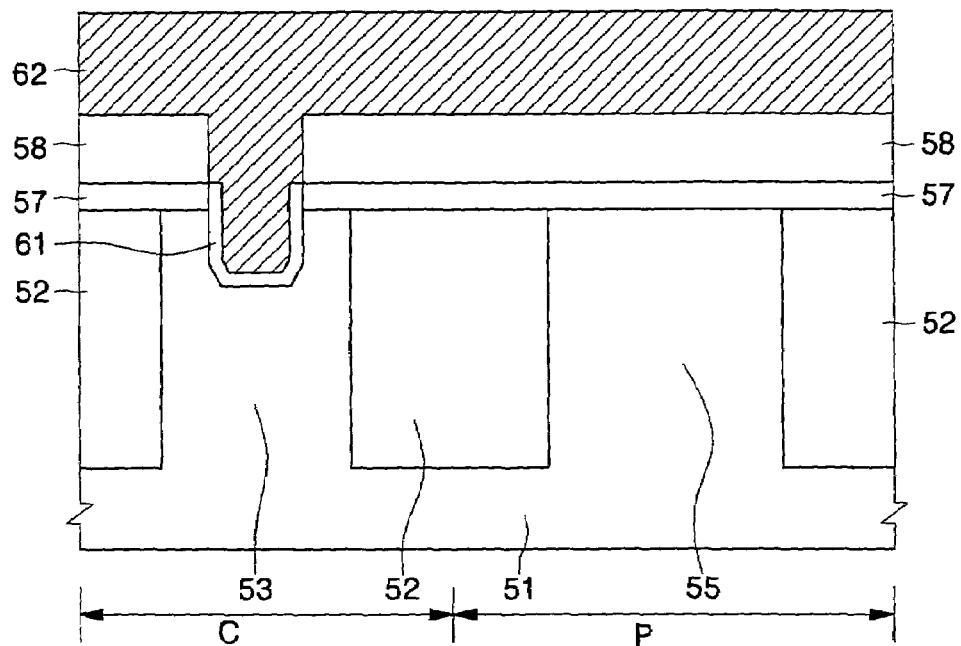

Referring to FIG. 14, a cell gate dielectric layer 61 is formed on sidewalls and a bottom surface of the cell gate groove 60a. The cell gate dielectric layer 61 may be a silicon oxide layer formed by thermal oxidation. Alternatively, the cell gate dielectric layer 61 may be a silicon oxide layer or a high-k dielectric layer formed by ALD. A cell gate conductive layer 62 is formed on the semiconductor substrate 51 including the cell gate dielectric layer 61. The cell gate conductive layer 62 may be a polysilicon layer.

Figure 15:
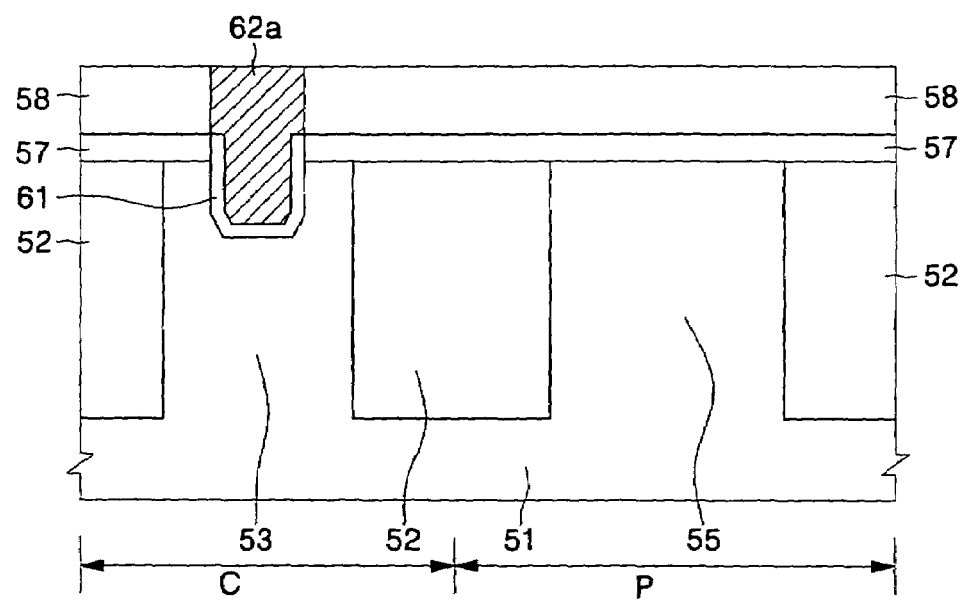

Referring to FIG. 15, the cell gate conductive layer 62 is planarized to form a cell gate electrode 62a. The planarization process may be performed using a CMP technique which employs the polish stop layer 58 as a stopper.

Figure 16:
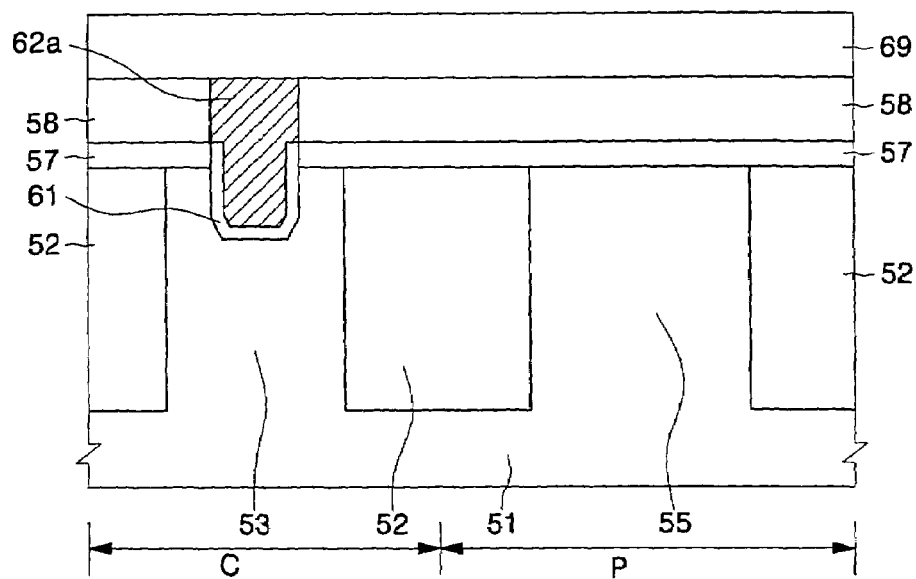

Referring to FIG. 16, a cell gate protection layer 69 is formed on the semiconductor substrate 51 including the cell gate electrode 62a. The cell gate protection layer 69 is deposited to cover the cell gate electrode 62a and the polish stop layer 58. The cell gate protection layer 69 may be a high density plasma oxide layer.

Figure 17:
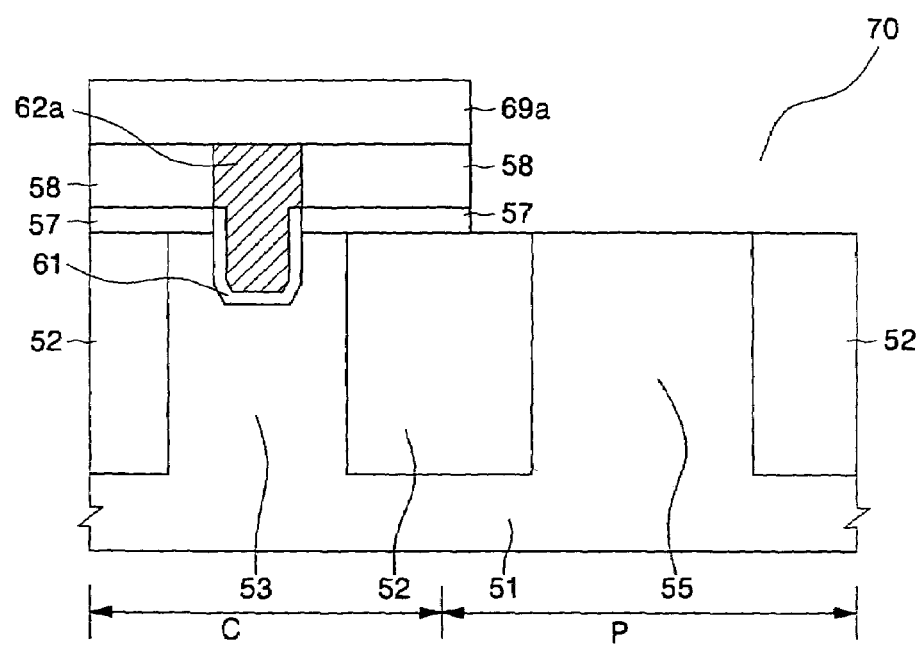

Referring to FIG. 17, the cell gate protection layer 69 is patterned to form a cell gate protection layer pattern 69a, for example, using photolithography and/or etching processes. Then, the patterned mask layer is etched using the cell gate protection layer pattern 69a as an etching mask to form a peripheral gate opening 70 which crosses over a portion of the peripheral active region 55. As a result, an upper surface of a portion of the peripheral active region 55 is exposed.

Additional dopants may be introduced into a portion of the peripheral active region 55 through the peripheral gate opening 70, for example, by ion implantation. In other words, the peripheral active region 55 may be selectively doped using the cell protection layer 69a as an implantation mask to block implanting into the cell active region 53. Ions may be implanted into the peripheral active region 55 at various angles using various ion implantation energies. For example, ions may be implanted into the peripheral active region 55 at the same implantation energy level as used to simultaneously implant the cell and peripheral active regions 53 and 55 in the prior doping step. Alternatively, ions may be implanted into the peripheral active region 55 at a different implantation energy than used to simultaneously implant the cell and peripheral active regions 53 and 55. Accordingly, the cell and peripheral active regions 53 and 55 may have different carrier concentrations.

Figure 18:
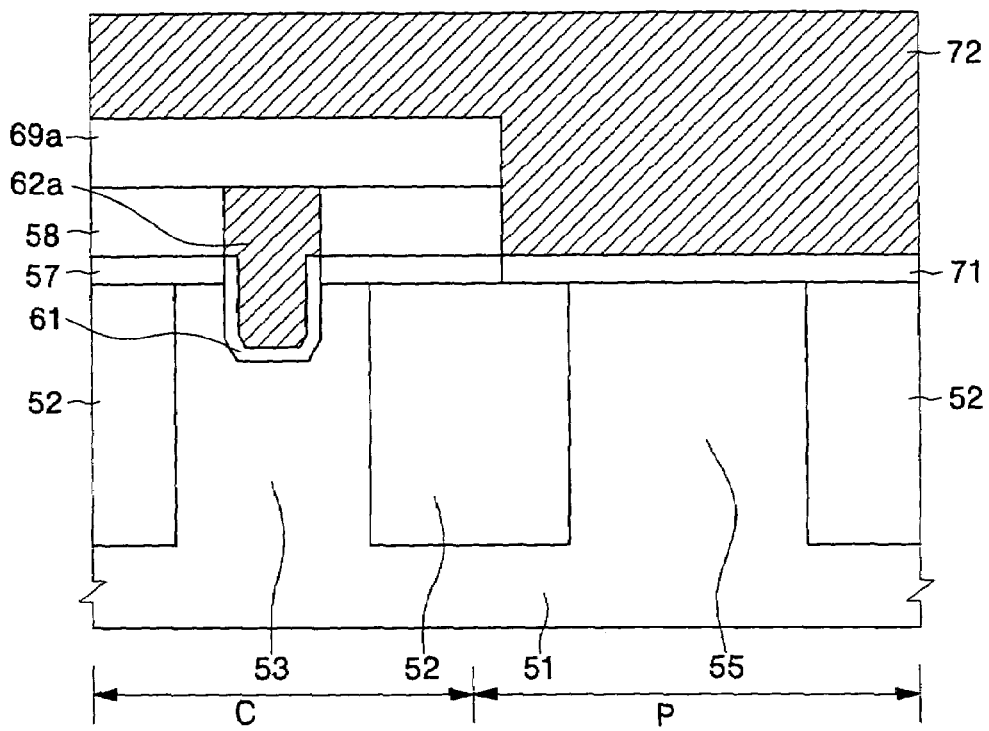

Referring to FIG. 18, a peripheral gate dielectric layer 71 is formed on the exposed portion of the peripheral active region 55. The peripheral gate dielectric layer 71 may be a silicon oxide layer formed by thermal oxidation. Alternatively, the peripheral gate dielectric layer 71 may be a silicon oxide layer or a high-k dielectric layer formed by an ALD technique. The peripheral gate dielectric layer 71 may be formed to a different thickness than the cell gate dielectric layer 61 to be suitable for a peripheral circuit. A peripheral gate conductive layer 72 is then formed on the semiconductor substrate 51 including the peripheral gate dielectric layer 71. The peripheral gate conductive layer 72 may be formed of a polysilicon layer.

Figure 19:
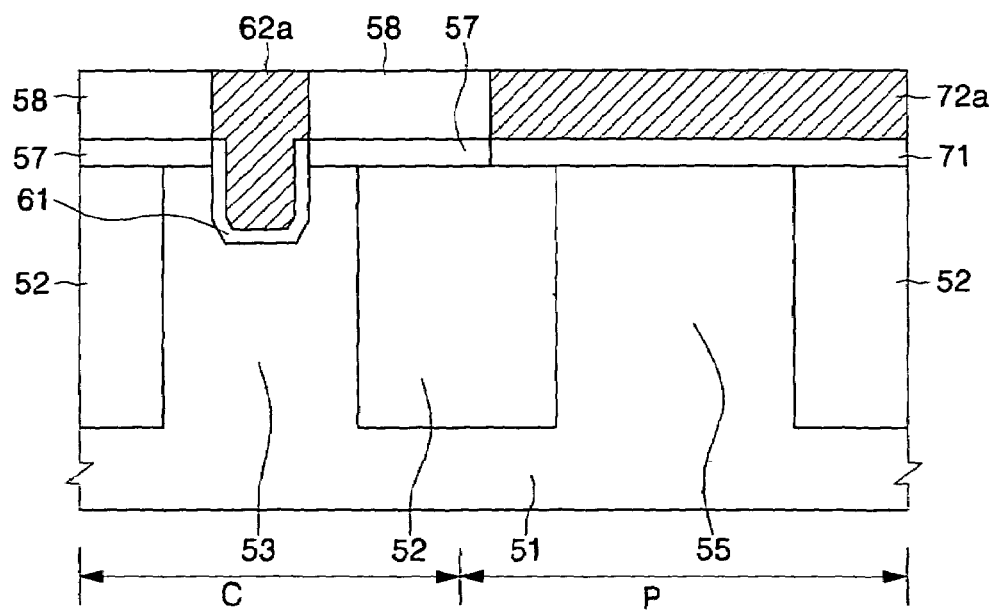

Referring to FIG. 19, the peripheral gate conductive layer 72 is planarized to form a peripheral gate electrode 72a. The planarization process may be performed using a CMP technique which employs the polish stop layer 58 as a stopper. At this time, the cell gate protection layer pattern 69a may be removed altogether. As a result, upper surfaces of the peripheral gate electrode 72a and the cell gate electrode 62a are exposed.

Figure 20:
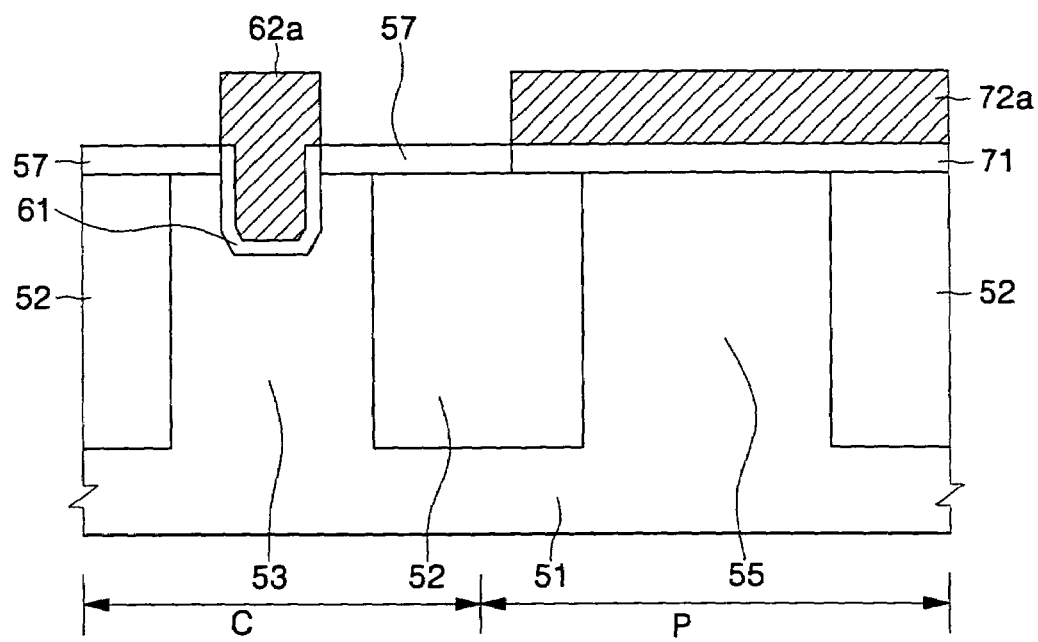

Referring now to FIG. 20, the polish stop layer 58 is etched to complete the insulated cell gate electrode 62a in cell array region C and the insulated peripheral gate electrode 72a in peripheral circuit region P. During the etching of the polish stop layer 58, the cell active region 53 and the peripheral active region 55 (which may be covered by the buffer layer 57) are protected from etching damage.

Subsequently, source and drain regions (not shown) are formed in the cell active region 53 and the peripheral active region 55 using the cell gate electrode 62a and the peripheral gate electrode 72a as respective masks, and then an interlayer insulating layer is formed. Finally, source and drain electrodes are respectively formed on the source and drain regions. As a result, a recessed channel FET is formed in cell array region C, and a planar FET is formed in peripheral circuit region P.

According to embodiments of the present invention as described above, different transistors may be sequentially formed in the cell array region and the peripheral circuit region of a semiconductor substrate. Thus, a fin FET and/or a recessed channel transistor which may be suitable for higher device integration may be formed in the cell array region, and planar transistors suitable for various other uses may be formed in the peripheral region. In addition, since doping and/or implantation of the peripheral circuit region may be separately performed, the carrier concentration of the peripheral channel region may be adjusted to be different from that of the cell channel region. Further, the peripheral gate dielectric layer may have a different thickness and may be formed of a different material than that of the cell channel region.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and detail may be made without departing from the spirit and scope of the present invention as set forth in the following claims.

That which is claimed is:

1. A method of forming an integrated circuit device, the method comprising:
   preparing a semiconductor substrate having a cell region and a peripheral circuit region;
   forming a trench isolation layer in the semiconductor substrate to define a cell active region in the cell region and a peripheral active region in the peripheral circuit region;
   forming a mask layer on the trench isolation layer and the active regions;
   forming a non-planar field-effect transistor selected from the group of a FinFET and a recess channel FET in the cell region;
   forming a cell protection layer on the non-planar field-effect transistor and the mask layer; and
   forming a planar field-effect transistor in the peripheral circuit region by:
      selectively removing the cell protection layer and the mask layer to form a peripheral gate opening on the peripheral active region;
      forming a peripheral gate conductive layer to fill the peripheral gate opening and cover the cell protection layer; and
      planarizing the peripheral gate conductive layer and the cell protection layer to expose the mask layer so as to define a peripheral gate electrode in the peripheral gate opening.

2. The method of claim 1, wherein planarizing the peripheral gate conductive layer and the cell protection layer is performed using a Chemical Mechanical Polishing (CMP) technique.

3. The method of claim 1, further comprising the following after selectively removing the cell protection layer and the mask layer to form a peripheral gate opening on the peripheral active region:
   selectively implanting dopants into a channel region of the planar field-effect transistor in the peripheral active region using the cell protection layer as a mask to block implanting of the dopants into the cell active region.

4. The method of claim 1, wherein the cell protection layer is formed of a high density plasma oxide layer.

5. The method of claim 1, wherein the mask layer comprises a polish stop layer and a hard mask layer stacked thereon.

6. The method of claim 5, wherein the polish stop layer is formed of a silicon nitride layer, and wherein the hard mask layer is formed of a silicon oxide layer.

7. The method of claim 1, wherein forming the non-planar field-effect transistor comprises:
   patterning the mask layer to form a cell gate opening which crosses over the cell active region;
   etching the trench isolation layer using the patterned mask layer as an etch mask to form a cell gate groove which partially exposes sidewalls and an upper surface of the cell active region; and
   forming a cell gate electrode which fills the cell gate groove.

8. The method of claim 7, further comprising the following after etching the trench isolation layer:
   selectively implanting dopants into a channel region of the non-planar field-effect transistor in the cell active region using the patterned mask layer as a mask to block implanting of the dopants into the peripheral active region.

9. The method of claim 7, wherein forming the cell gate electrode comprises:
   forming a cell gate conductive layer to fill the cell gate groove and cover the patterned mask layer; and
   planarizing the cell gate conductive layer to expose the patterned mask layer.

10. The method of claim 7, wherein the non-planar field-effect transistor comprises the FinFET, and wherein the cell active region is a fin-shaped active region vertically protruding from the substrate.

11. The method of claim 1, wherein forming the non-planar field-effect transistor comprises:
    patterning the mask layer to form a cell gate opening which crosses over the cell active region;
    etching the cell active region using the patterned mask layer as an etch mask to form a cell gate groove which partially recesses the cell active region; and
    forming a cell gate electrode in the cell gate groove.

12. The method of claim 11, further comprising the following after etching the cell active region:
    selectively implanting dopants into a channel region of the non-planar field-effect transistor in the cell active region using the patterned mask layer as a mask to block implanting of the dopants into the peripheral active region.

13. The method of claim 11, wherein the non-planar field-effect transistor comprises the recess channel FET, and wherein a bottom of the cell gate electrode is lower than a top surface of the cell active region.

* * * * *